United States Patent
Alvité

[19]

[11] Patent Number: 5,809,639
[45] Date of Patent: Sep. 22, 1998

[54] AUTOMATED COMPONENT PLACEMENT APPARATUS

[75] Inventor: Joseph Alvité, Wyoming, Minn.

[73] Assignee: Robodyne Corporation, Minneapolis, Minn.

[21] Appl. No.: 712,935

[22] Filed: Sep. 13, 1996

Related U.S. Application Data

[60] Division of Ser. No. 148,639, Nov. 8, 1993, Pat. No. 5,562,384, which is a continuation-in-part of Ser. No. 811,940, Dec. 23, 1991, Pat. No. 5,259,500.

[51] Int. Cl.⁶ ............................ H05K 3/30; H05K 13/04; H05K 13/08; B23P 21/00
[52] U.S. Cl. ............................... 29/740; 29/741; 29/759; 414/736; 901/41
[58] Field of Search .............................. 29/740, 741, 759, 29/703, 711; 294/88; 414/736; 901/40, 41

[56] References Cited

U.S. PATENT DOCUMENTS

| | | | |
|---|---|---|---|
| 4,307,832 | 12/1981 | Taki et al. .............................. | 29/740 X |
| 4,327,482 | 5/1982 | Araki et al. ............................ | 29/759 X |
| 4,438,559 | 3/1984 | Asai et al. ................................ | 29/740 |
| 4,607,873 | 8/1986 | Nusbaumer et al. ..................... | 294/88 |
| 4,655,676 | 4/1987 | Jannborg et al. ........................ | 414/736 |
| 4,693,505 | 9/1987 | DiMeo ..................................... | 294/119 |
| 4,741,078 | 5/1988 | Kimura ....................................... | 29/39 |
| 4,819,699 | 4/1989 | Brown et al. ............................ | 140/105 |
| 4,905,938 | 3/1990 | Braccio et al. .......................... | 244/161 |
| 4,918,804 | 4/1990 | Bleuel et al. ................................ | 29/33 |
| 5,036,582 | 8/1991 | Usui .......................................... | 29/740 |
| 5,142,771 | 9/1992 | Merkt et al. .............................. | 29/751 |
| 5,259,500 | 11/1993 | Alvite et al. ............................. | 206/330 |
| 5,495,661 | 3/1996 | Eromer et al. ............................ | 29/740 |

FOREIGN PATENT DOCUMENTS

| | | | |
|---|---|---|---|
| 160068 | 7/1986 | Japan ........................................ | 29/741 |

*Primary Examiner*—Peter Vo
*Attorney, Agent, or Firm*—Faegre & Benson

[57] ABSTRACT

An automated component placement apparatus for use in populating circuit boards with electronic components. The apparatus includes a plurality of toolheads for picking up and placing components, a plurality of component feeders, a transport means to move PC boards between PC board assembly areas for placement of components, and a plurality of gantry systems for moving the toolheads between the component supply stations and PC board assembly areas. A plurality of programmable controllers actuates both the toolheads to grip or release components and the gantry systems to move the toolheads between the component supply stations and PC board assembly areas.

9 Claims, 27 Drawing Sheets

```
                    ┌─────────┐
                    │  FIG.   │
                    │  26B    │
                    └────┬────┘
                         │
```

Disengage upper long horizontal RoboSplice cyl.
NOTE: Bring it to the ready position for tape splicing and unsplicing.

Engage upper long horizontal RoboSplice cyl. to feed leader over pin drive tape.

Disengage upper short horizontal RoboSplice cyl., to move the leader over the drive pins.
NOTE: Brings it to the ready position for tape splicing and unsplicing.

Disengage upper Z-axis RoboSplice release cyl. to release male connector and clear the gripper fingers from the connector and place tape on drive pins.
NOTE: Bring it to ready position for tape splicing and unsplicing.

Using forward motion, activate the pin drive to advance the leader tape out of the cartridge, through the feeder and to the lower tape connector interface point.

Engage lower Z-axis RoboSplice release cyl. to bring leader gripper into leader connector.

```
         ┌──────────┐
         │   See    │
         │ FIG 26C  │
         └──────────┘
```

| Advance component tape, pulling with it the leader tape from the just unloaded cartridge, to the connector interface point so that the RoboSplice can be performed. |
|---|

| Disengage upper access door cyl. to lock the tape connectors in cartridge by closing the access door.<br>NOTE: The upper cartridge is now _full_ of _empty_ pallets. |
|---|

| Engage upper Z-axis RoboSplice release cyl. to move leader gripper fingers into leader tape connector and diconnect component tape from the leader tape by actuating locking arms.<br><br>NOTE: Gripper holds the leader connector in this position until a packed cartridge replaces this unpacked cartridge. |
|---|

| Remove upper cartridge by pulling it horizontally along track, this motion automatically locks front access door. |
|---|

```
                    ╱ Are more ╲
         Yes       ╱  parts     ╲
  ( B )◄─────────(   needed at   )
                  ╲  this time? ╱
** See Note Below  ╲           ╱
                      │ No
                 ┌────┴────┐
                 (   End   )
                 └─────────┘
```

| NOTE: At point B operations reverse, causing all forward commands to become reverse, and all upper cartridges refers to the lower cartridge. This occurs to make the process as efficient as possible. This feeder operates in both directions which allows user to replace only one cartridge and eliminates rethreading of the loose tape end every cycle. Sensors check conditions throughout cycle to ensure correctness of process. |
|---|

Figure 26G

AUTOMATED COMPONENT PLACEMENT APPARATUS

REFERENCE TO PRIOR APPLICATIONS

This application is a division of application Ser. No. 08/148,639, filed on Nov. 8, 1993, now U.S. Pat. No. 5,562,384 which is a continuation-in-part of application Ser. No. 07/811,940, filed on Dec. 23, 1991, now U.S. Pat. No. 5,259,500.

BACKGROUND OF THE INVENTION

The present invention relates generally to assembly of small manufactured parts. In particular, the present invention is a programmable, automated, gantry-mounted, apparatus for populating circuit boards with individual electronic components.

In the past, manufacturers employed manual labor for the assembly of small parts. However, manual assembly can be slow and human error can lead to mis-assembled parts. Transportation, telecommunications, computer, consumer electronics, and other industries required production means that were faster, more accurate, and more efficient. Thus, automated systems for assembling electronic circuit boards and other types of components have become commercially available from a number of manufacturers.

One such system utilizes a turret-type robot to place components from a parts feeder onto a circuit board. The turret-type robot supports a toolhead which rotates about a center axis so the work envelope of the toolhead is limited to a circular radius. Often, circuit boards are presented to the workstation on a linear conveyor. After a part has been placed, the conveyor indexes the PC board to another workstation. Also, the circuit boards are frequently presented to the toolhead just inside the toolhead's work envelope. Thus, such workstations can only populate a single PC board per index of the supply conveyor. This may lower the speed at which a completely populated PC board can be produced.

Moreover, since turret-type robots have a circular work envelope, it may be difficult to place them closely adjacent to one another in a manner that takes up little floor space; if robots are placed too closely, the toolheads could enter one-another's work envelope and collide. Further, such workstations commonly utilize bowl-type component feeders. Such feeders use a vibrating bowl to move components down a channel to a pick-up station. Again, because of the bulky bowls, such feeder systems may be difficult to place in close proximity to each other and expensive factory floor space can be wasted.

There is, therefore, a continuing need for improved component assembly systems. To be commercially viable, any such system must be fast and accurate, and efficient to manufacture. The system should also make efficient use of space.

SUMMARY OF THE INVENTION

The present invention is an improved gantry robot, component placement apparatus for populating PC boards with electronic components in a rapid, space efficient manner. In one embodiment, a plurality of toolheads adapted to pick up and release small electronic components, pick up parts from a plurality of component feeder stations. A plurality of gantry systems move the toolheads to an associated PC board assembly area. The toolheads then place the components into the appropriate locations on PC boards located at the associated PC board assembly areas. A transport means moves PC boards between PC board assembly areas. The placement apparatus utilizes a plurality of programmable controllers to initiate the described functions.

BRIEF DESCRIPTION OF THE DRAWINGS

FIGS. 26A through 26G, inclusive, show a generalized flow diagram of controller operation.

DESCRIPTION OF THE PREFERRED EMBODIMENT

Figure 1:
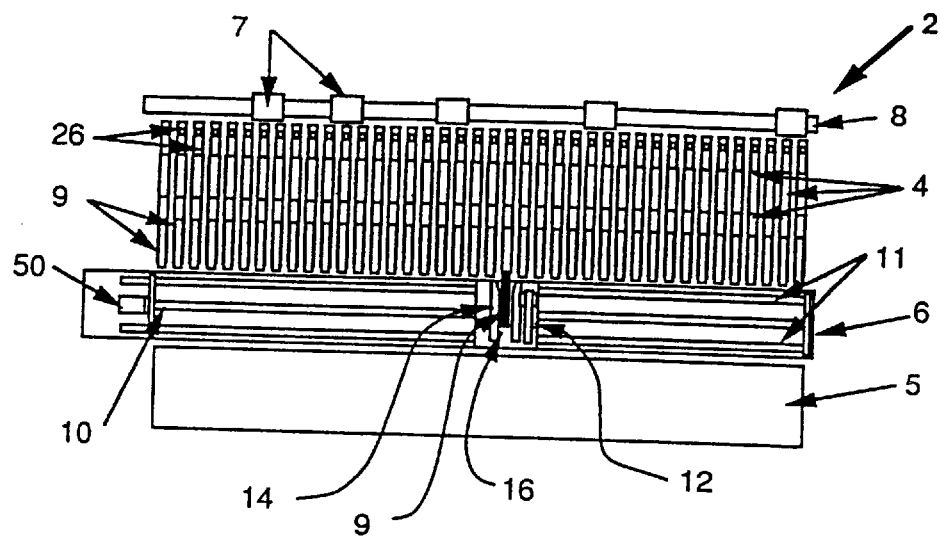
FIG. 1 is a plan drawing of one multi-feeder, packaging system and cartridge support server.

Referring to FIG. 1, a top plan view is shown of the organizational layout of one possible, relatively sophisticated odd component packaging or feeder system 2. The system 2 incorporates numerous tape cartridge feeder stations or feeders 4 of the present invention. The particular details of the feeder station 4 will be discussed in detail in the following description.

Figures 2A, 2B:
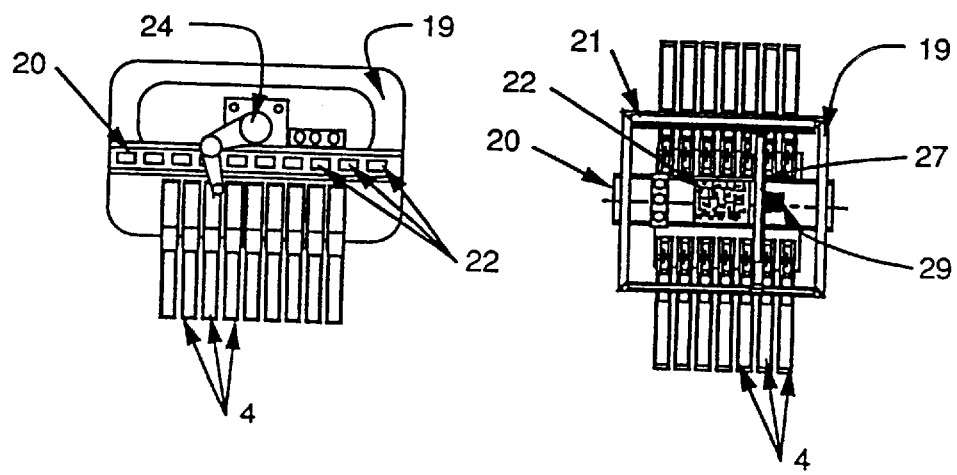
FIG. 2a is a plan drawing of a component placement work station or workcell, supported by a number of component feeders.
FIG. 2b is a plan drawing of an alternative workcell and arrangement of the component feeders and control arm.

For the system 2, a number of feeder stations 4 are positioned between a transversely mounted cartridge server conveyor 5, a cartridge loading means 6 and a component conveyor 8 or assembly station (reference FIGS. 2a, 2b). Depending upon the system function, whether packaging odd components within the cartridges 9 or unloading odd components from the cartridges 9, the server 6 conveys cartridges 9 to and from each of the individual feeder stations 4 in response to control signals identifying the filled/empty status of each of the cartridges 9.

The server 6 in response to the control signals induces a driven lead screw assembly 10 to positionally align a cartridge carrier 12 in relation to a particular one of the plurality of feeder stations 4. A slide arm 14 of the carrier 12 is activated to induce an empty slide tray 16 to extend and engage one of the component cartridges 9 of the selected feeder station 4. The cartridge 9 can either be filled or empty.

Upon grasping the cartridge 9, the slide tray 16 is retracted and withdrawn into registration with the carrier 12. Either the same or a second slide arm 14 containing a complementary filled or empty cartridge 9 is next indexed into alignment with the feeder 4 and extended to cause its cartridge to engage with the feeder 4. The parallel server conveyor 5, in turn, automatically replenishes the server carrier 12 with appropriate cartridges and extracts the populated or depleted cartridges 9. In a less automated setting, one or more of the foregoing functions can be performed manually.

Mounted in transverse relation to the opposite end of each of the plurality of feeder stations 4 is a component or work object conveyor 8. If the system is populating the tape cartridges 9, each feeder 4 may include a gantry mounted pick-and-place assembly 26 (reference FIG. 3) to select parts from the conveyor 8 and populate its cartridge 9. Alternatively, a plurality of assemblies, such as printed circuit boards (PCB) 7, may be conveyed in controlled relation to each feeder 4 or may be stationed at a number of component placement stations, where the PCB's are populated with parts extracted from the tape cartridges 9 of the feeder stations 4.

Where the PCB's 7 are being conveyed from feeder-to-feeder, each feeder station 4 may provide a particular component type, which may be the same or different from each neighboring station 4. Regardless, each feeder station 4 selectively extracts the components of the cartridges 9 and positionally mounts the components to each PCB 7. Upon incrementally advancing each PCB 7 past the feeder stations 4, each PCB 7 can be substantially populated with minimal human intervention.

With reference to FIG. 2a, a component placement station 19 is shown wherein nine feeder stations 4 are positioned relative to a transverse conveyor 20 including printed circuit boards 22. The PCBs 22 are populated via a single robotic control arm 24 having a single tool head which selects appropriate components from each feeder station 4 under system control. In contrast, the feeder stations 4 of the system 2 each included a gantry arm assembly 26 containing a multi-faceted pick-and-place tool head 33, which will be described below.

In accordance with the present invention, FIG. 2b depicts an alternative component placement station 19. Instead of an articulating robotic arm 24, a single track mounted gantry assembly 29 is provided which contains a single multi-faceted tool head (not shown). Tool head movement is directed above the feeders 4 and conveyor 20 within known coordinates of a pre-defined Cartesian workcell. That is, the gantry 29 moves longitudinally in the direction of rail 21, while the tool head extends and retracts along the gantry and laterally of the conveyor 20. Specific gantry and tool head movement is determined for four axes of motion (X, Y, Z and theta rotate) under system control relative to the location of the component pallet, the PCBs 22 being populated and the available components at the feeders 4.

Figure 3:
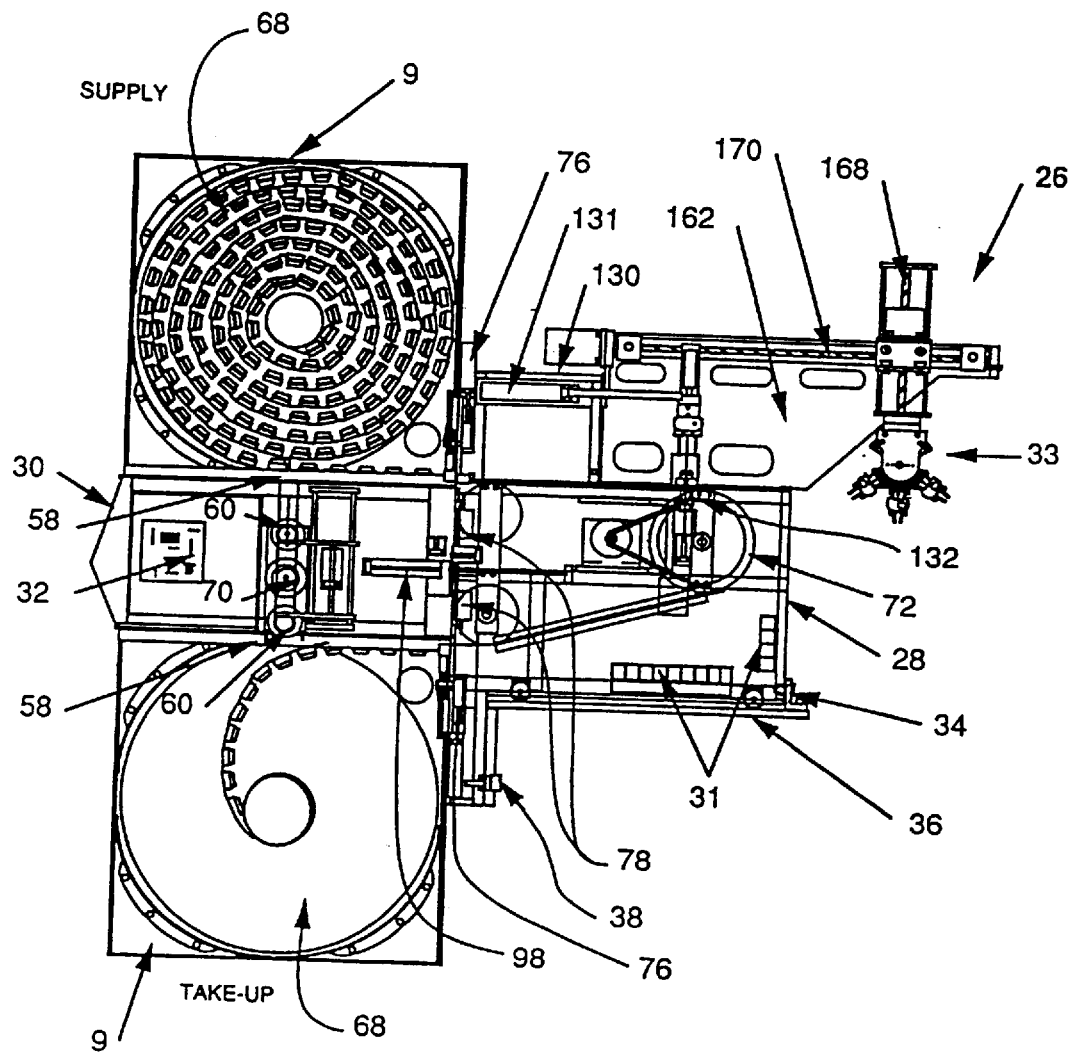
FIG. 3 is an elevation drawing shown in partial cutaway of one of the component feeder stations including a tool head containing gantry.
Figure 4:
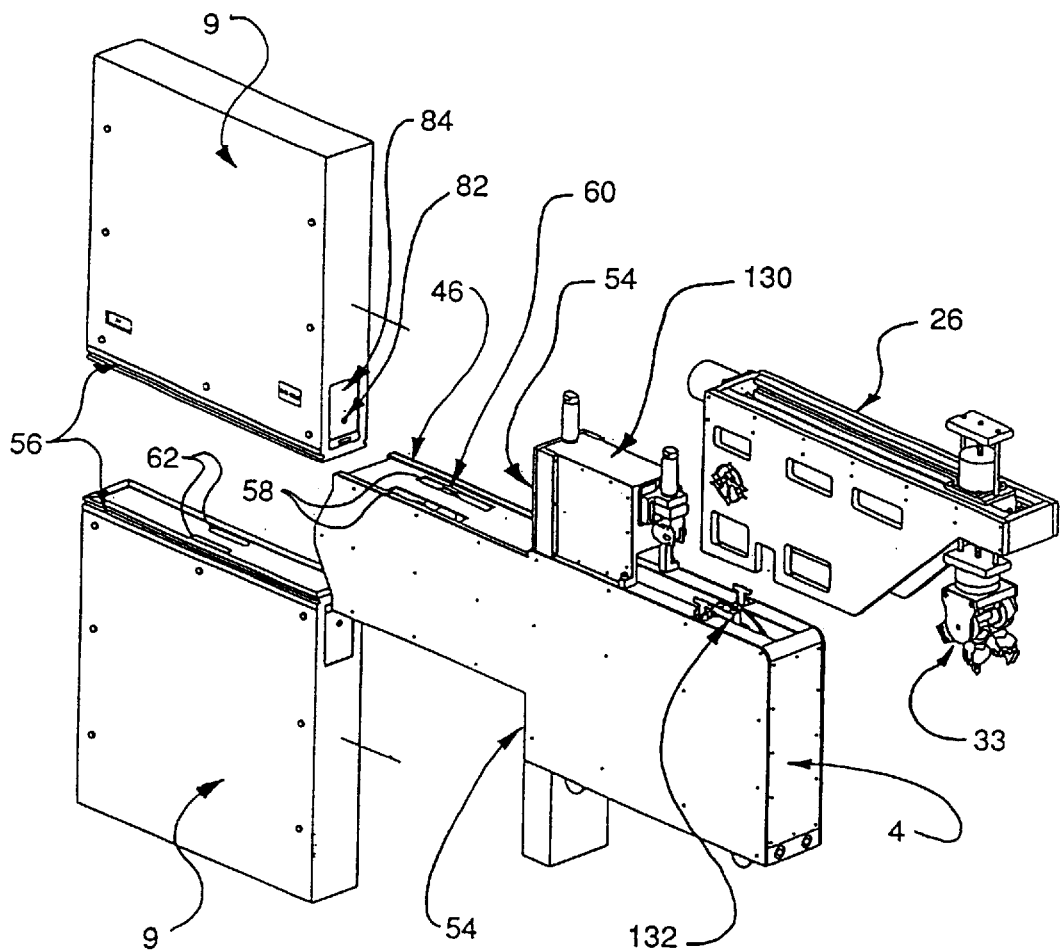
FIG. 4 is a perspective drawing of a component feeder station wherein the tape cartridges and tool head and gantry are shown in exploded assembly.

With attention next directed to FIGS. 3 and 4, a detailed elevation and exploded assembly drawing are shown of one of the feeder stations 4 of FIGS. 1. For the depicted construction, a gantry arm assembly 26 is provided at each feeder 4 which contains a multi-faceted, tool head 33. As apparent from FIGS. 2a and 2b, the structure of each feeder 4 and station can be modified, depending upon the system requirements.

Generally, each feeder 4 is configured about a frame superstructure that is covered with a sheet metal cabinet or housing 28. The housing 28 contains the feeder control assemblies (i.e. pneumatic/hydraulic and electric), a control panel 30 and the associated tape handling assemblies which are described in greater detail below. The control panel 30 interacts with a multi-board, microprocessor based electronic controller 32 and associated solenoid activated, pneumatic and hydraulic controls, reference FIG. 25. Typically, twelve solenoids 31 are provided with each feeder 4. A plurality of plug-in ports 38 permit coupling appropriately sized pneumatic and electrical supply sources and communication lines (not shown) to power the feeder 4. Mating couplers connected to a service table (not shown) interface with the feeder at locating pins 34 which extend from a support base 36.

FIGS. 26A through 26G disclose a functional flow diagram of the operational source code implemented in on-board PROM memory 40. Additional instructions can be programmed by the system user via a micro computer 42 into memory associated with the microprocessor controller board 44.

Figure 25:
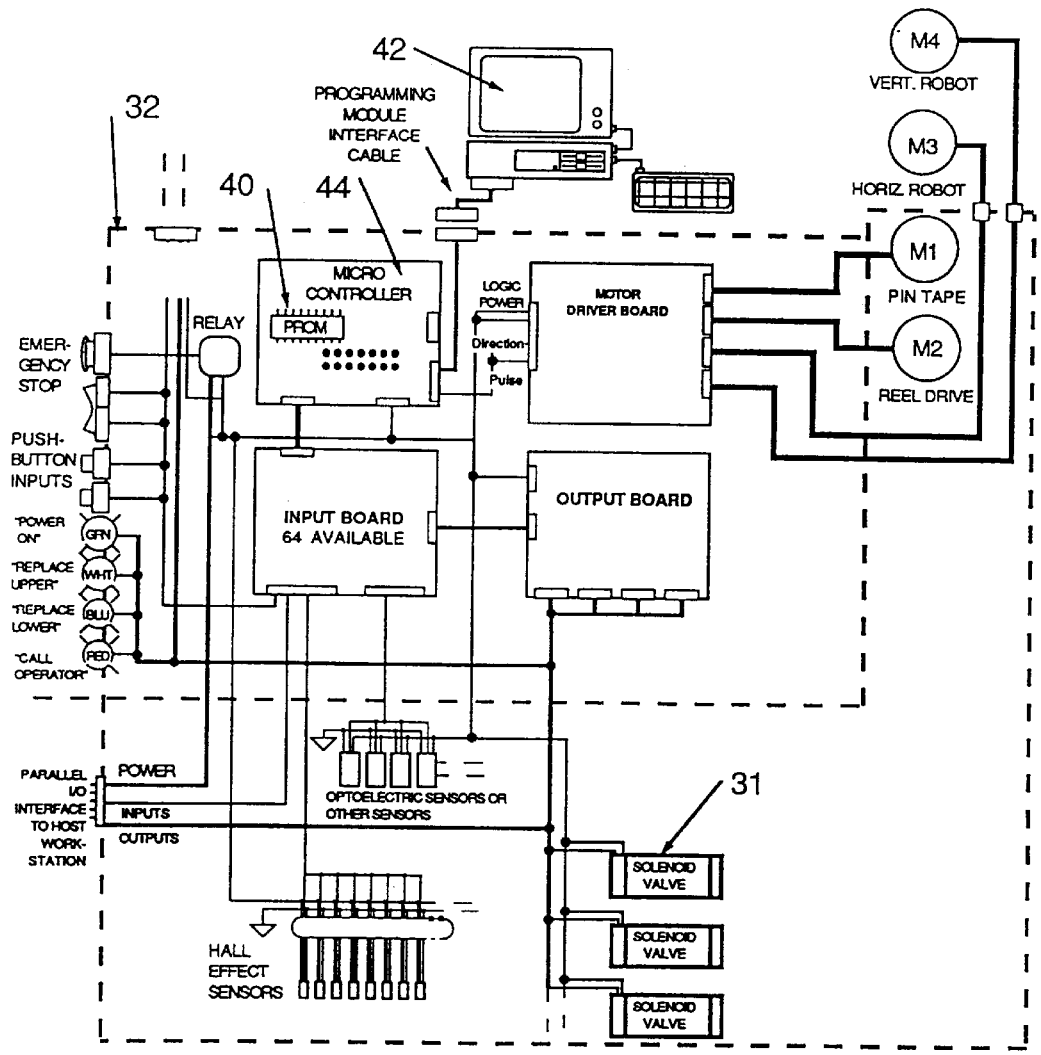
FIG. 25 is a functional block diagram of the plug-mounted hydraulic/pneumatic and electrical controller.
Figure 26A:
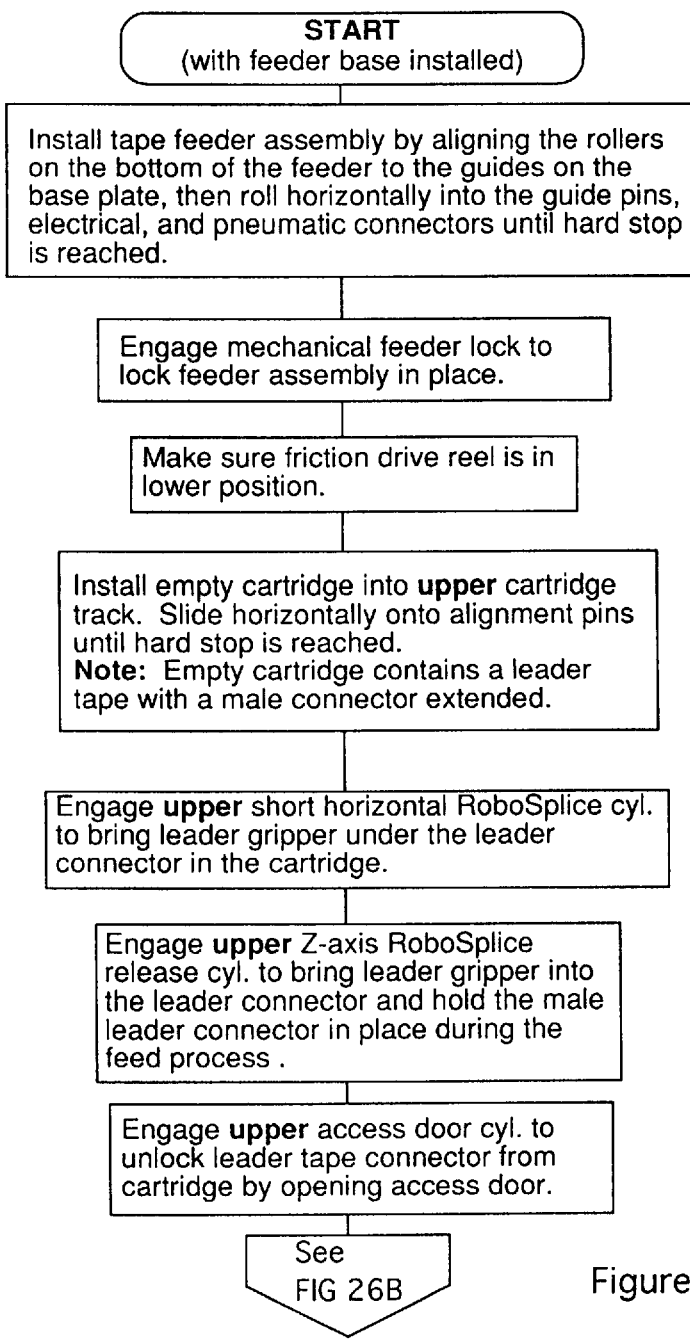
Figure 26C:
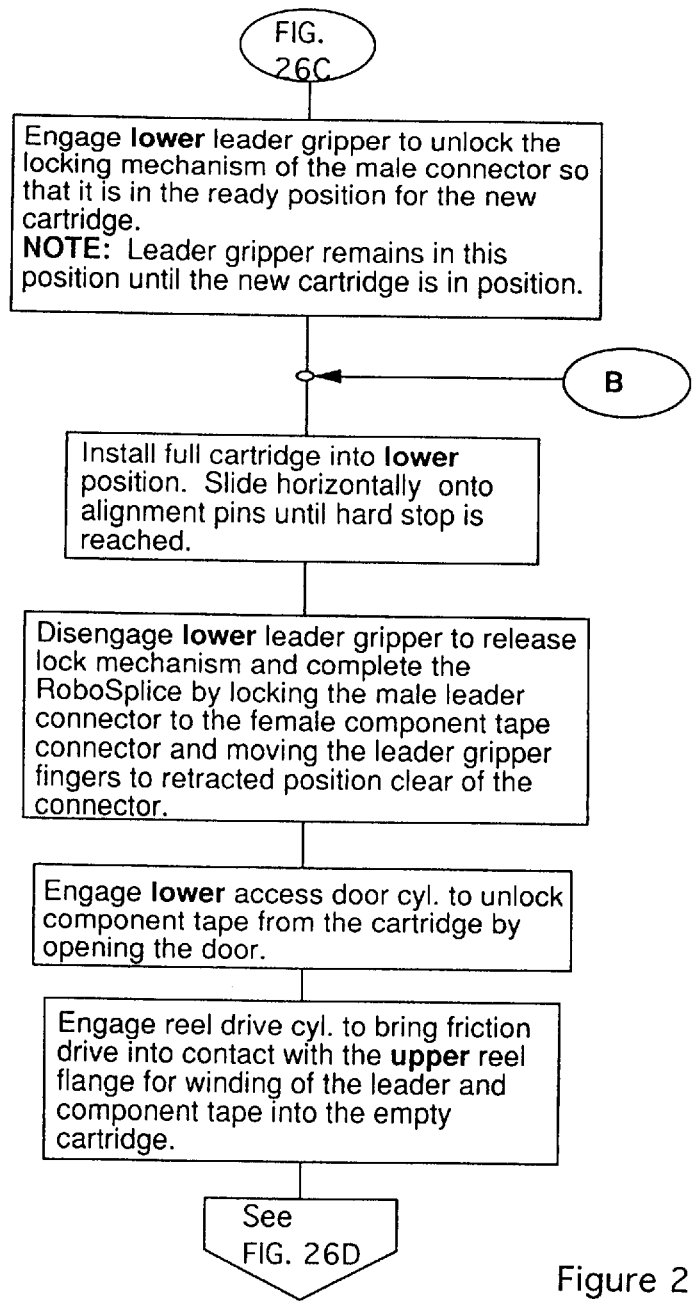
Figure 26D:
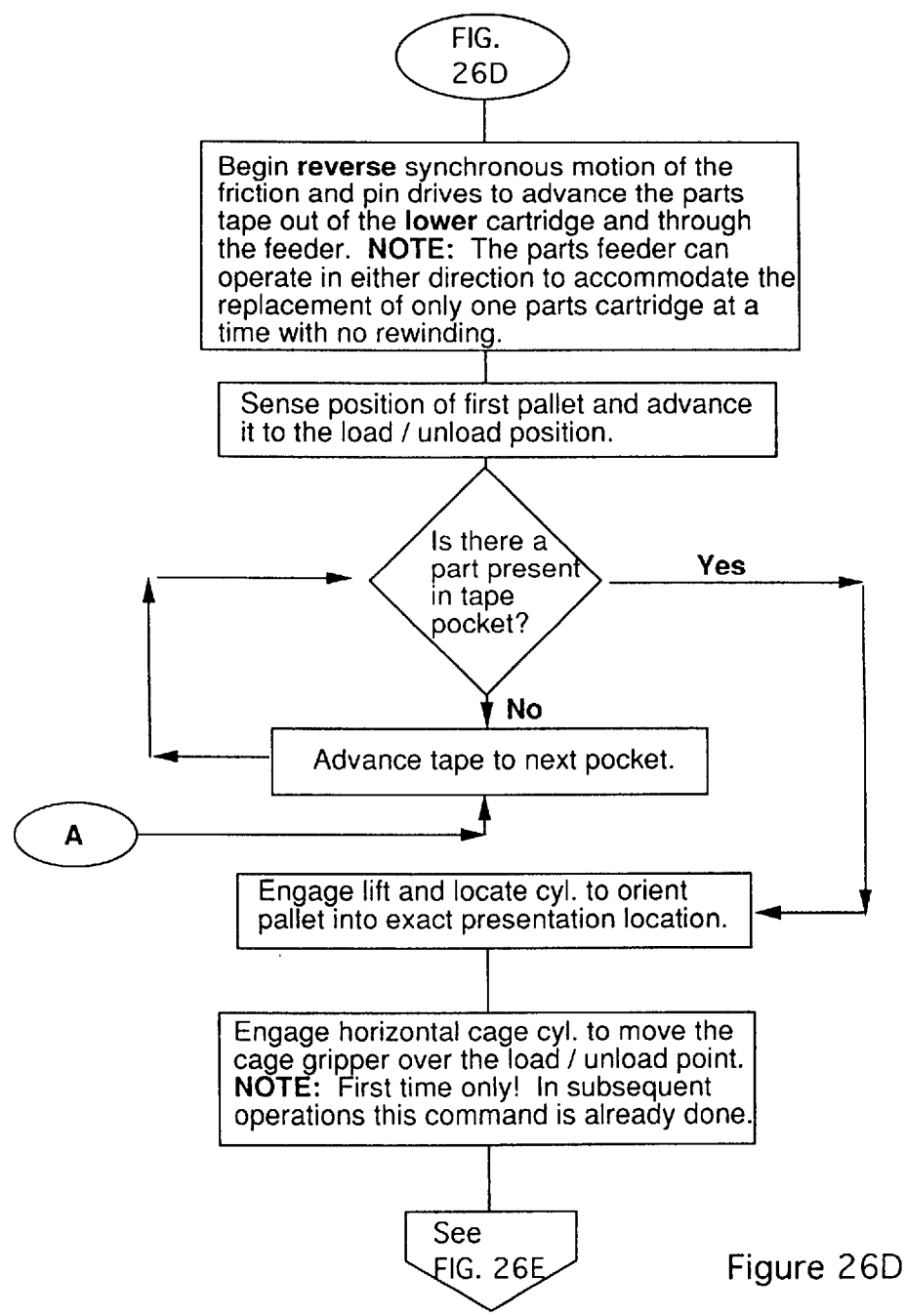
Figure 26E:
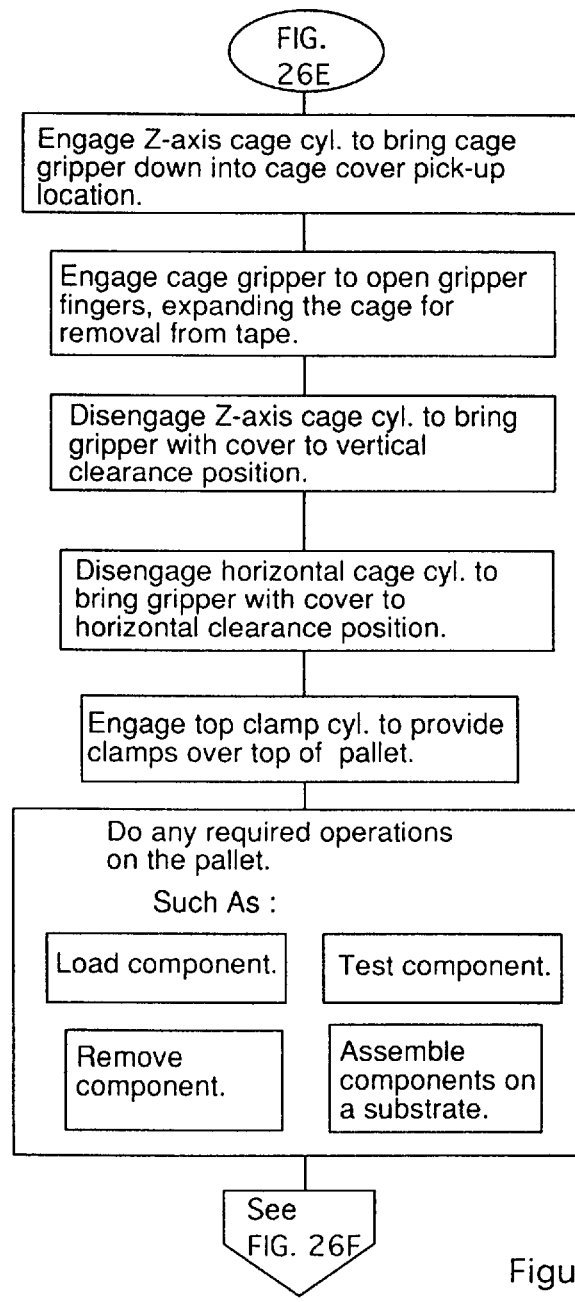
Figure 26F:
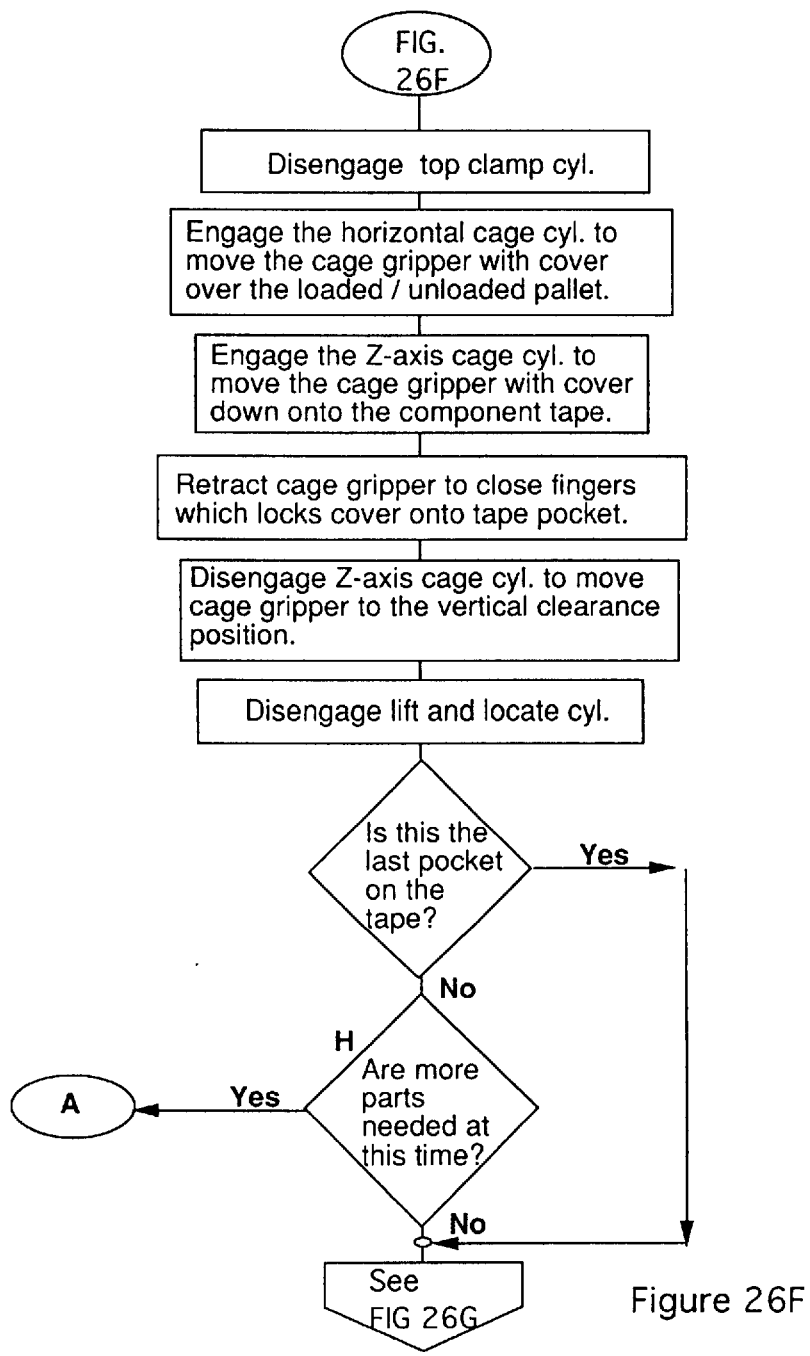

Mounted to a aft and operator accessible surface of the housing 28 is the control panel 30. A plurality of manual control switches, push buttons, pilot lights and the like are mounted to the panel and interface with the microprocessor board 44 via an input board. FIG. 25 depicts more of the details of the manual controls. Most typically, the controls are accessed during initial system and feeder setup or manual operation, such as when initially splicing the tape cartridges together or when performing maintenance on the feeder.

Secured to the upper and lower aft surfaces of the housing 28, just forward of the control panel 30, are dove tail slide track assemblies 46, reference FIG. 4. The track assemblies 46 receive and contain the supply and take-up component cartridges 9. Two slide assemblies 46 are provided which are identical to one another, although only the upper assembly is depicted at FIG. 4.

Because the present feeders 4 are normally operable in a cyclic fashion, neither one of the cartridge positions continuously functions as a supply or take-up cartridge. Rather, the positions alternate relative to component flow through the feeder assemblies 4. That is and as will become more apparent hereinafter, the tape direction alternates with each cycle. For example and as depicted at FIG. 3, as a filled tape moves from the upper "Supply" cartridge 9 to the lower, "Take-up" cartridge 9, during the first half of a cycle, the components are removed.

With the emptying of the upper cartridge 9, a tape leader and connector block are eventually extracted and positioned for subsequent operations to be described below. The lower cartridge 9 then contains the depleted tape and is removed. A full component cartridge 9 is then mounted to the lower cartridge position and spliced to the upper, now empty supply cartridge which becomes the take-up cartridge and the drive direction is reversed. Handling time of the populated and empty cartridges 9 is thus reduced. For certain applications, it may however be desired to provide a single direction parts flow, with attendant increased cartridge handling.

Returning attention to FIG. 1 and although the cartridges 9 can be manually maintained, FIG. 1 depicts an automatic cartridge server assembly 6. The server 6 includes a lead screw 10, which along with a pair of slide rails 11 supports a screw follower mounted slide carrier 12 and a pair of cartridge support trays 16. The server 6 may include duplicate arrangements of upper and lower cartridge trays 16 for achieving the necessary loading/unloading at each feeder station.

Control signals, which typically are of a pulse width modulated variety, are applied from the controller 32 to drive a stepper motor 50 coupled to the lead screw 6. The slide trays 16 are thereby appropriately aligned with the depleted and full cartridges 9. The empty tray is extended and retracted to remove an empty cartridge 9 and the other tray re-loads the feeder 4 with a full cartridge. Tray movement is controlled to insure that the cartridges 9 are locked to the housing 28 and a forward surface adjacent a cartridge accessing station 54 (reference FIG. 4).

Formed within the upper and lower surfaces of the housing 28, adjacent the slide rails 46, are pairs of adjacent slots or apertures 58 and through which frictional drive wheels 60 extend. The drive wheels are biased a sufficient height to extend interiorly of the cartridges 9 at matching cartridge apertures 62 to contact and rotate the peripheral surfaces of a tape reel 68 mounted within each cartridge 9, reference FIG. 3. The drive wheels 60 are driven via a drive assembly 70 and reel drive motor M2 (reference FIG. 25).

A dual drive assembly 70 is particularly provided which can be resiliently biased up or down to appropriately drive the tape of the upper or lower cartridge 9, until a sprocket tape drive assembly 72 captures the tape. This occurs in a region slightly forward of the cartridges 9 and will be described in greater detail below.

Figure 5:
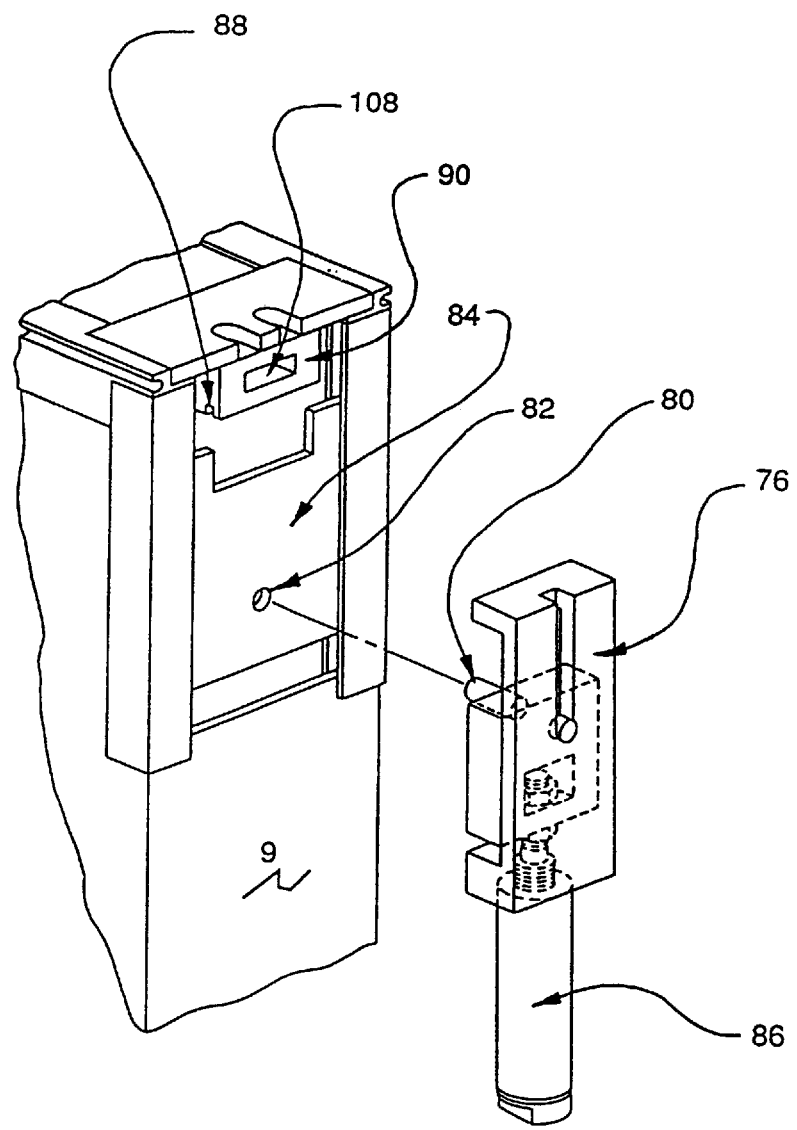
FIG. 5 is a perspective drawing of the tape cartridge door opener assembly.

Mounted forward of the reel drive assembly 70, adjacent the forward face of each cartridge 9 are upper and lower cartridge access or tape splicing stations 54. The splicing stations are identical to each other. Each includes a cartridge door opening assembly 76 and a splicing assembly 78. The specific constructional details of the assemblies 76 and 78 can be seen upon reference to FIGS. 5 and 6.

Each door opener assembly provides a projecting lug 80 which mates with an aperture 82 formed in a spring loaded cartridge slide door 84. The lug 80 is vertically operable via an associated solenoid and pneumatic or hydraulic directed piston 86 to raise and lower the slide door 84 in response to signals from the controller 32. The lower edge of the door 84 is thereby released from a groove 88 formed within a surface of a female coupler or splice block 90. The splice block 90 is attached to the leading end of a tape leader 92 secured to the internal tape reel 68. More of the details of the construction of each cartridge 9, tape leader 92 and splice blocks 90 can be seen upon reference to FIGS. 6, 7, 16 and 17.

Figure 6:
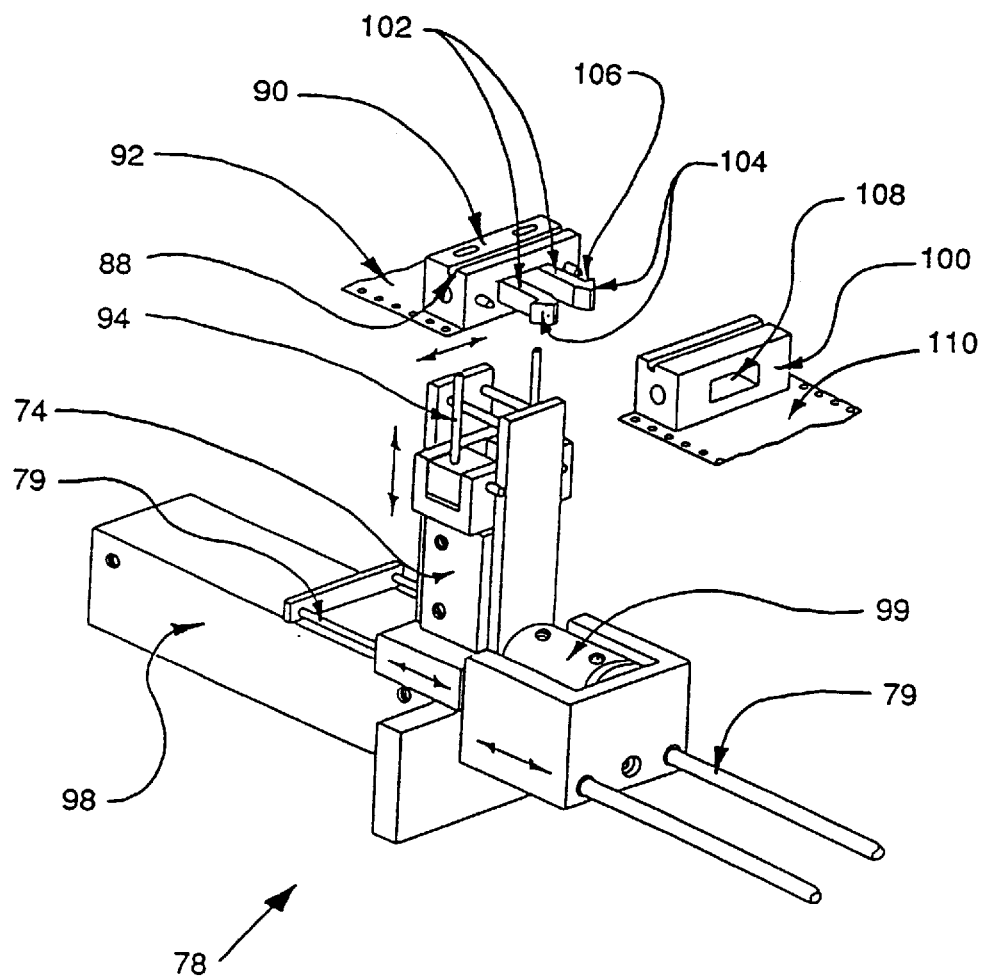
FIG. 6 is a perspective drawing shown in exploded assembly of the tape splicing assembly and the tape splice blocks.
Figure 7:
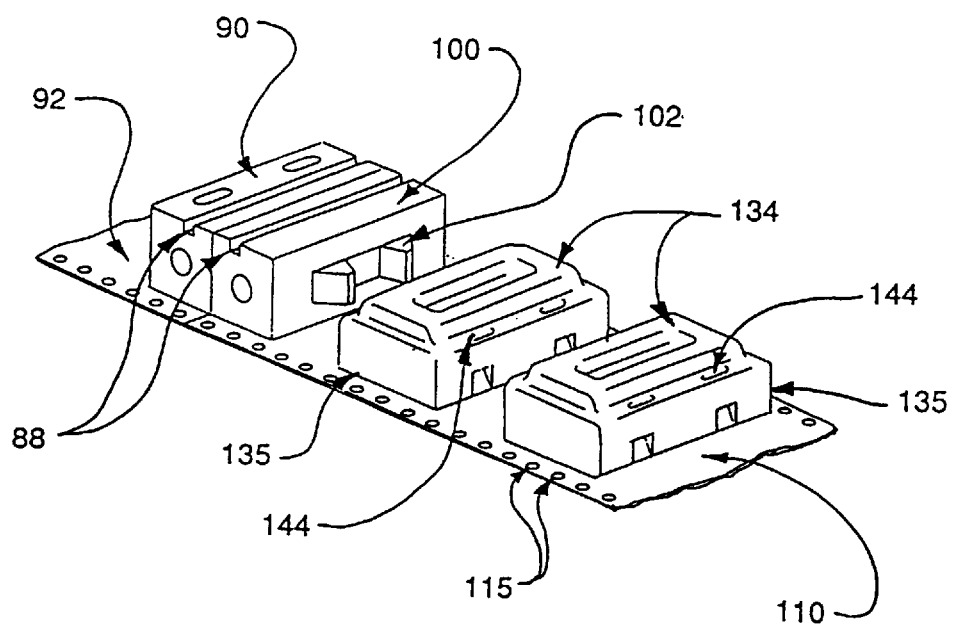
FIG. 7 is a perspective drawing of the connected tape ends.

Referring to FIG. 6 and with the release of the door 84 from the block 90, the tape leader 92 is advanced to the splicing assembly 78 via a threader assembly 98. Actuation of a pair of opposed threader cylinders 99 extends and retracts the splicing assembly causing it to move to and fro along paired sets of guide rods 79. A vertical control cylinder 74 causes a pair of pins 94 to grasp the block 90 and contract a pair of spring biased fingers 102. Subsequent actuation the cylinders 99 aligns and directs the tape leader 92 along lateral edge guides which rise from the surface of the housing 28 to loosely constrain and confine the leader travel, without allowing the leader to buckle. A male splice block 100 is concurrently restrained adjacent the splicing assembly 78 from the previous full cartridge 9, which now comprises the take-up cartridge.

The advancement of the male connector block 90 via the cylinders 99 causes the connector and splice blocks 90 and 100 to couple. That is, the fingers 102 of the male splice block 90, which include tapered fore-ends 104 and a flange 106, are inserted within the mating longitudinal aperture 108 of the female splice block 100. With a subsequent removal of the pins 94, the fingers 102 expand to cause the flanges 106 to couple one block to the other. The splicing assembly 78 is then released from the coupled blocks 90, 100.

During an uncoupling operation, the pins 94 contract the fingers 102 to release the splice blocks from one another. The pin carriage is then retracted to separate the blocks. During initial threading, the actuation of the cylinders 99 also advances the tape carrier 92 onto the tape drive assembly 72.

With the release of the splice blocks 90, 100, the reel drive 70 is engaged to the depleted cartridge to induce the leader 92 to be taken up into the cartridge 9. The cartridge 9 can then be removed and replaced with a new cartridge 9. The male splice block 100 meanwhile is restrained at the splice station 78 and to the sprocket tape drive 72. The slide door 84 of the new cartridge is next retracted and the tape leader 92 is advanced by the reel drive 70 to achieve coupling. As the feeder operation cycles, the cartridge take-up and supply positions alternate, however, the positions of the male and female splice blocks remain constant relative to the splice station 78. Once the tape ends are coupled (reference FIG. 7), the sprocket tape drive assembly 72, which is contained within the housing 28 forward of the splicing assembly 78, determines subsequent movement of the tape 110.

Figure 8:
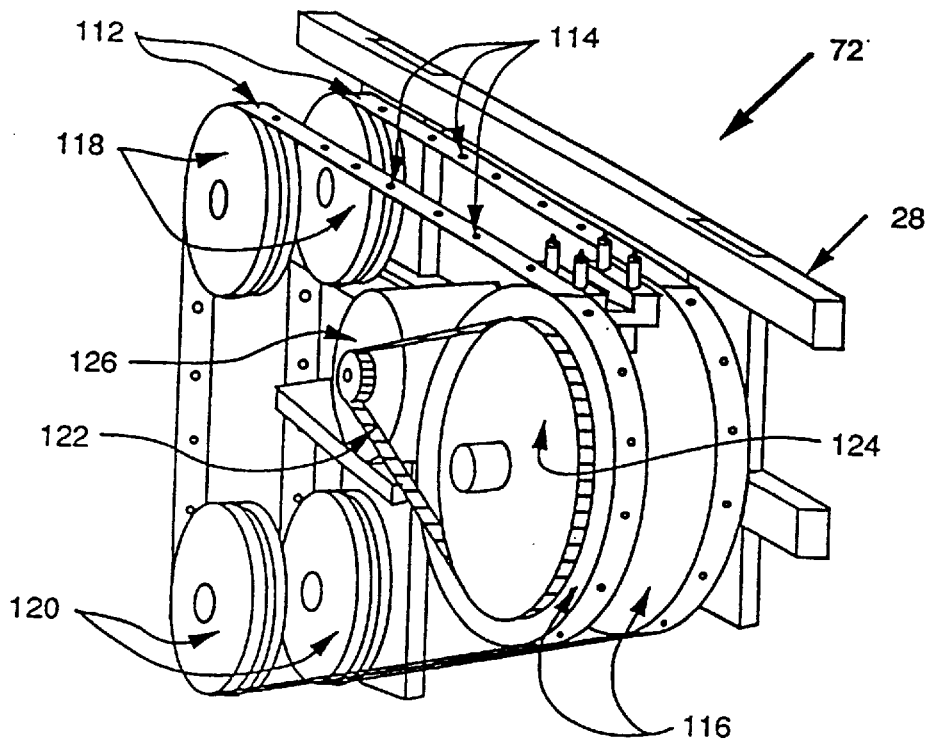
FIG. 8 is a perspective drawing of the clutch driven, pinned drive tape assembly.
Figure 8A:
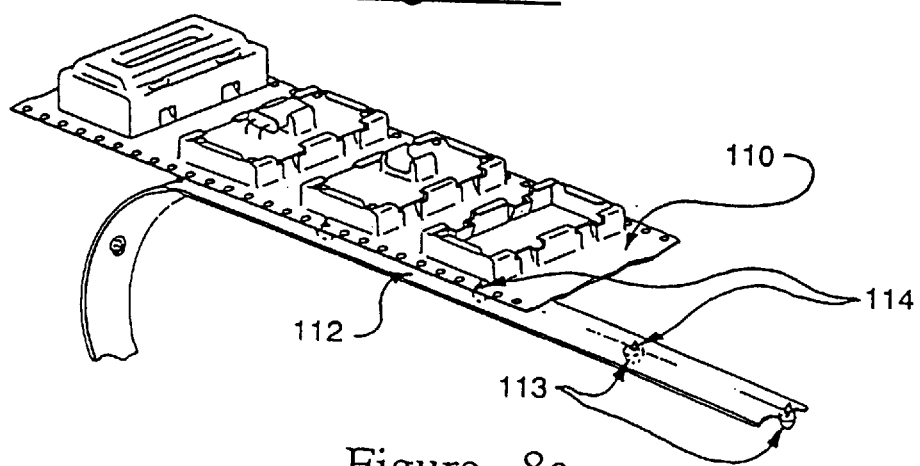
FIG. 8a is a detailed cross section drawing of a portion of the drive tape in relation to a typical tape carrier.

With reference to FIGS. 8 and 8a, the tape drive assembly generally comprises a pair of endless, metal drive bands 112 which include a plurality of dual purpose, drive lugs 113 and drive pins 114. The pins 114 mate with apertures 115 let into the lateral edges of the tape 110. The drive bands 112 are wound about and in frictional contact with three pairs of drive wheels 116, 118 and 120. The drive wheels 116 contain recesses which mate with the drive lugs 113 and are driven via a notched belt 122, pulley 124 and stepper motor 126. The other pairs of wheels 118 and 120 act as idler wheels and are free spinning with the bands 112. Slippage is thereby minimized at any of the drive wheels 116, 118 or 120, which slippage could translate at the control circuitry into component misalignment (either real or apparent) relative to the splicing assembly 78, cover removal assembly 130 and lift and locate assembly 132.

In the event of a condition wherein the parts tape 110 binds or is otherwise placed under undue stress, the bands 112 can slip relative to the tape 110 or stepper motor 126 to prevent breaking the tape carrier. The amount of slippage is dependent upon drive band tension, which is adjustable at a tensioner assembly.

Slippage induces an alarm condition and, depending upon the amount of slippage, can be automatically corrected by the controller 32. Alternatively, should the tape 110 become disengaged from the drive bands 112, the loss of tension causes the controller 32 to stop drive power and annunciate an appropriate operator alarm.

Figure 9:
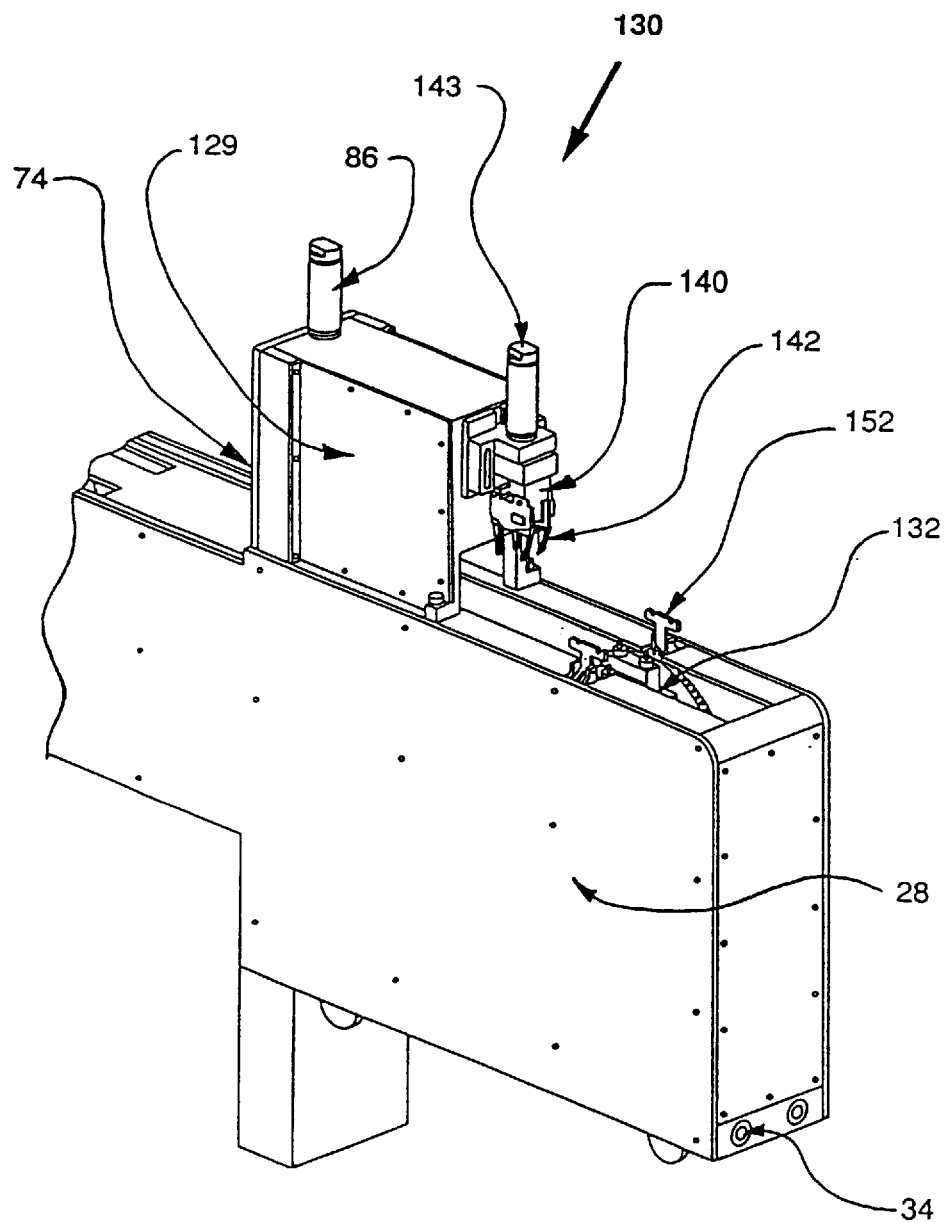
FIG. 9 is a perspective drawing of the cover removal assembly shown in retracted relation to the tape carrier clamping assembly.

From the splicing assembly 78, the tape 110 is advanced past the cover removal assembly 130 to the lift and locate station or assembly 132. With reference to FIG. 9, a detailed perspective drawing is shown of the assembly 130 which extends above the housing 28 and the path of the tape carrier 110, forward of the splicing assembly 78. The principal operation performed by the assembly 130 is to remove the Faraday cage or cover 134 (reference FIG. 7) from each of the plurality of storage sites or component compartments 135 located on the tape carrier 110.

The cover removal assembly 130 includes an extractor head 140. The extractor head 140 is capable of vertical and longitudinal movement via a pair of fluid controlled cylinders. A cylinder 131 mounted beneath the cover 139 (reference FIG. 3) controls longitudinal movement and a cylinder 143 secured to the head 140 controls vertical movement of the head 140.

Cover removal is particularly effected upon directing each component into alignment with the lift and locate assembly 132. The extractor head 140 is then extended and vertically lowered with sequential control of the cylinders 131, 143 such that a number of contained fingers 142 are projected through mating apertures 144 of the cover 134. As the fingers 142 are lowered, they flex the cover 134 to disengage the cover from mating tabs formed into the sidewalls of a raised ring that projects from the tape 110 (reference FIG. 17) to release the cover 134 from the tape 110. Upon release, the fingers 142 support the cover 134, which is then vertically retracted and cleared to one side, away from further operations. The component storage compartment 135 is then accessed to either fill the compartment 135 or extract contained parts.

Figure 10:
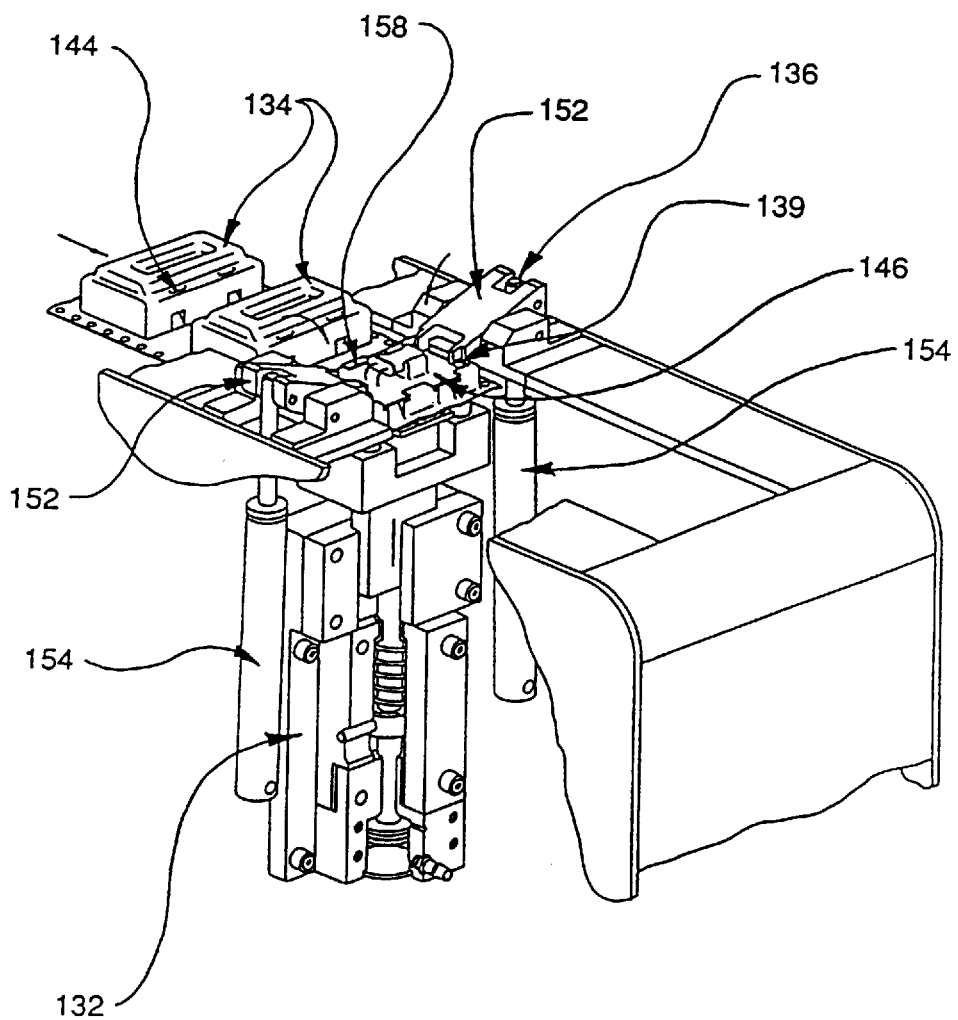
FIG. 10 is a detailed perspective drawing of the tape carrier clamping assembly.
Figure 11:
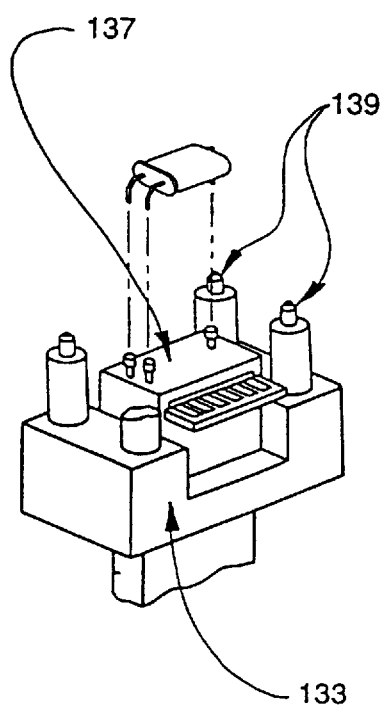
FIG. 11 is a perspective drawing of an electronic test platform useable with the assembly of FIG. 10.
Figure 12:
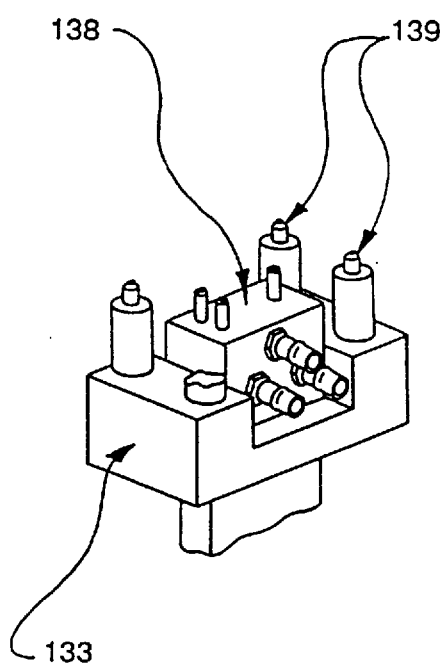
FIG. 12 is a perspective drawing of a pneumatic/fluid test platform useable with the assembly of FIG. 10.

Subsequent to removing and retracting each cover 134, the edges of a component support pallet 146 are clamped with a pallet clamping assembly 136, reference FIG. 10. The associated lift and locate assembly 132 is then engaged to support the bottom of the pallet and test components contained on the pallet, if desired. FIGS. 11 and 12 depict test fixtures 137 and 138 which contain electrical and/or pneumatic and fluid connectors which permit cursory electrical and mechanical integrity tests of each component. Varieties of other fixtures can be used, which either attach to the assembly 132 or to the tool head 33 to test the upper surfaces of each component. Appropriate temporary contacts/connections are thus made during testing without removing the component to confirm integrity. Depending upon test results, necessary actions can be taken to replace the defective component or pass over the component.

The clamping assembly 136 includes a pair of clamps 152 which are mounted to rotate in response to the extension and retraction of a pair of cylinders 154 mounted to each side of the tape 110. As the pallet 146 is clamped, the lift and locate assembly 132 is actuated to raise a pallet support platform 133 (reference FIGS. 11 and 12). A number of pins 139 project from the platform to engage apertures 156 formed in the outer periphery of the component pallet. The pallet 146 is thereby securely constrained between the pins 139 and clamps 152. As significant, the pallet 146 is restrained to a known reference location and relative to which the previously mentioned robotic arm 24 or the gantry mounted, multi-faceted tool head assembly 33 can access the contained components. The components can also be simultaneously tested at the fixtures 137 as they are loaded or removed.

Figure 13:
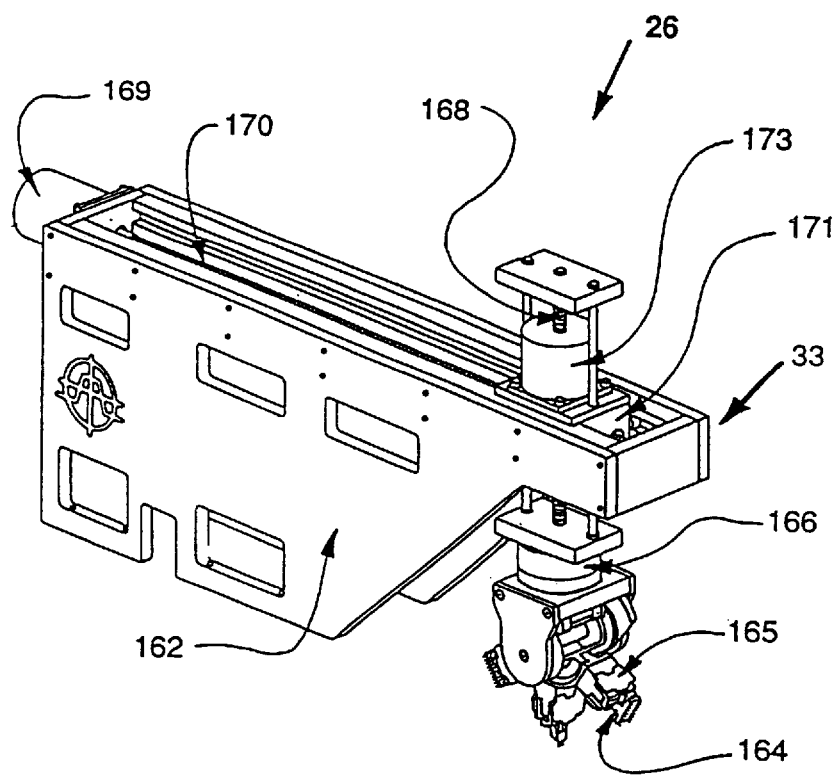
FIG. 13 is a perspective drawing of the gantry and multi-faceted component tool head.
Figure 14:
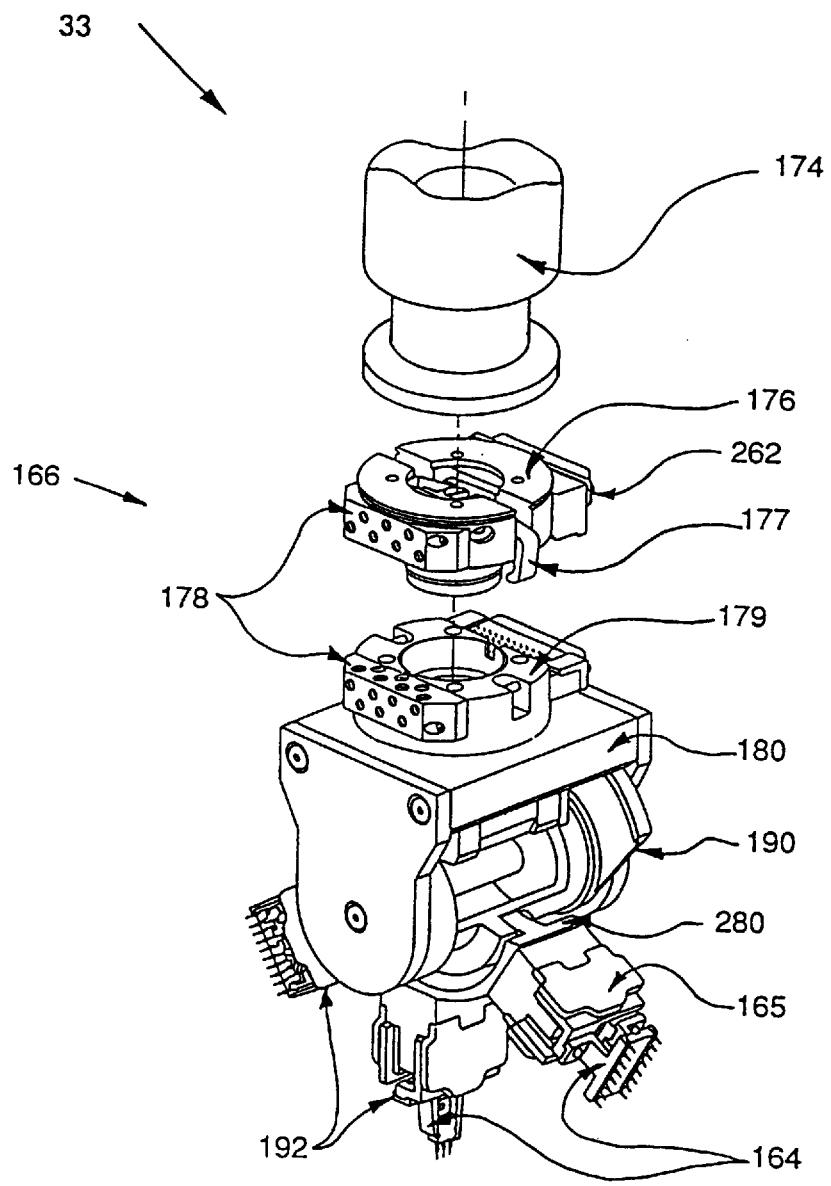
FIG. 14 is a detailed perspective drawing of the multi-faceted tool head and the tool head changer.

Returning attention to FIG. 3 and with additional attention to FIGS. 13 and 14, general and detailed views are shown of the gantry assembly 26 which supports the multi-faceted tool head assembly 33. The tool head assembly 33 contains a number of tool heads which typically contain pick-and-place fingers 164. The fingers 164 are secured to a gripper assembly 165 that determines finger movement. Each gripper 165, in turn, is secured to the tool head 33 via a coupler assembly 166.

The tool head assembly 33 is supported to the gantry 26 at a pair of driven lead screws 168 and 170. The assembly 33 is horizontally extensible via a servo-motor 169 and the screw 170 between each supported pallet 146 and the transversely mounted component containing conveyor 8 or work station 19. Otherwise, the assembly 33 is vertically extensible via a servo-motor 173 and the screw 168.

The lead screw 170 is particularly coupled to a carrier 171 that supports the lead screw 168 and servo-motor 173. The servo-motor 169 controls the position of the carrier 171 along the lead screw 170. The operation of the servo-motor 173, in turn, extends and retracts the pick-and-place fingers 164. The gripper assembly 165 causes the fingers 164 to appropriately contract or expand relative to the components. The particular tool head brought to bear and the force applied to grasp/release each component are determined by the controller 32 via control couplings to the tool head assembly 33.

A variety of tool heads, containing various facets and configurations of tools which mate with the components being accessed can be stored to one side of the housing 28. A three position, multi-faceted tool head 180 is particularly shown at FIG. 14. Alternatively, a single facet tool head may be secured to the coupler assembly 166. FIGS. 15*d* and 15*e* respectively depict four and five position tool heads 181 and 182.

The detailed construction of the tool head assembly 33 is depicted in FIGS. 14, 15*a–c* and 15*f*. With attention first directed to FIG. 14, the head assembly 33 includes a coupler assembly 166. The coupler assembly 166 provides a flanged collar 174 which projects from a platform of the carrier 171 at FIG. 13 and mates with an automatic tool coupler 176. The coupler 176 includes pneumatically operated fingers 177 which couple to a tool changer plate 179. A threaded collar and nut (not shown), which is captured to the collar 174, secures the coupler 176 to the collar 174.

A number of modular blocks 178 and 262, which contain pneumatic and electrical terminations, are also detachably mounted to the coupler 176 and plate 179. Appropriate conduits or wires mount between the ports of the blocks 178 or terminal strips of the blocks 262 to define the operation of the tool head. The specific control signals are determined by the microprocessor controller 44.

Flexible strip circuits may extend from the block 262 along appropriate surfaces of the head 180 to further points of connection with other flexible conductors that couple to the gripper 165 and tools 192. The circuits may comprise discrete assemblies or conductive zones or bands formed into or on the head 180. The circuits may couple to one another with a wiping action at junctions at each separately moveable assembly.

Figure 15A:
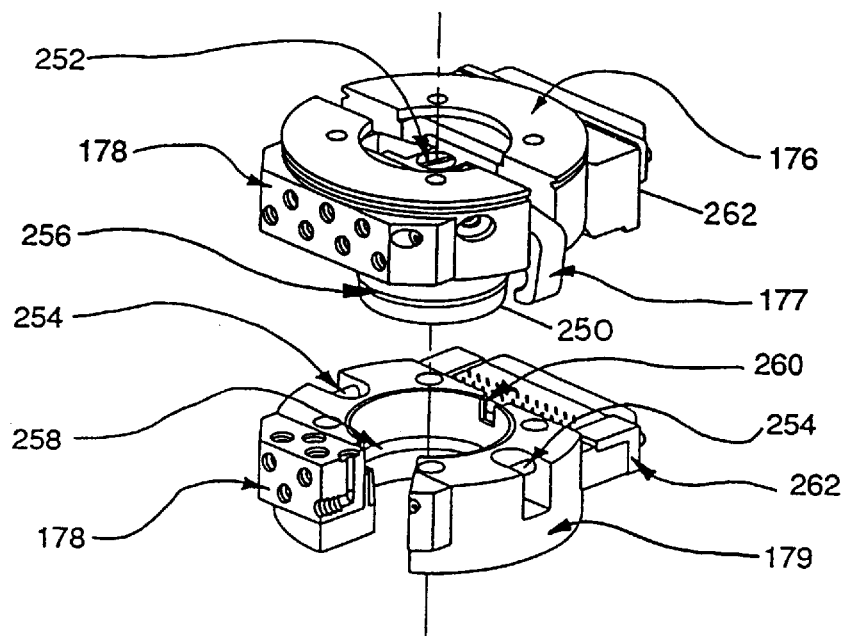
FIG. 15a is a detailed perspective drawing of the tool head changer of FIG. 14.
Figure 15B:
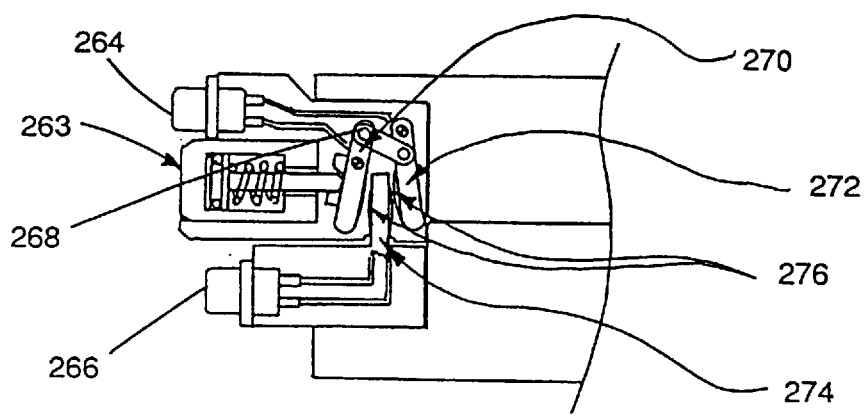
FIG. 15b is a detailed perspective drawing of a high current electrical connector to the tool head changer.

FIGS. 15*a* and 15*b* depict more of the details of the coupler assembly 176 and tool plate 179. These include a pneumatic cylinder (not shown) which extends from a linkage plate 252 that contains the fingers 177, reference FIG. 15*a*. The cylinder 250 actuates the fingers 177 which, in turn, couple and align with mating pins 254 in the tool plate 179. The coupler 176 and plate 179 are further aligned to each other at mating radial locating rings 256, 258, such as O'rings, and axial locating slots 260 and mating pins (not shown) which extend from the coupler 176. Terminal strips on the upper and lower faces of the blocks are thereby able to engage each other.

FIG. 15*b* depicts an electrical connector 263 having upper and lower terminal strips 264, 266 which couple to strips provided at the back vertical surface of each block 262. The connector 263 finds use for coupling high current signals to the electrical termination blocks 262 of the tool coupler 176 and plate 179. The block 263 exhibits a low coupling force and high current carrying capability via a linkage 268 that actuates articulating connector arms 270, 272 to close around a stationary arm 274 when the tool coupler 176 and plate 179 are coupled together. The arms 272 and 274 contain multiple conductive bands 276 that when brought into contact with each other create a circuit having high current capability.

Figure 15C:
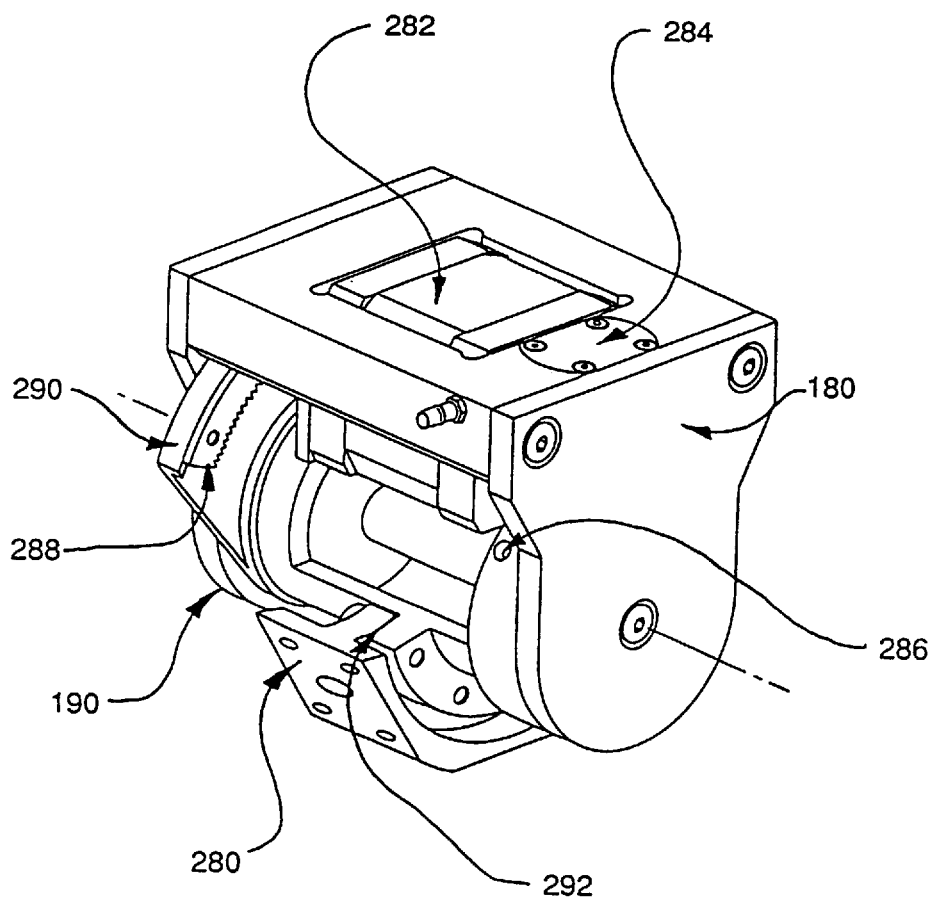
FIG. 15c is a detailed perspective drawing of the multi-faceted tool head.
Figure 15D:
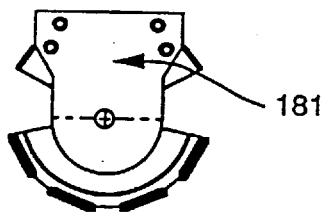
FIG. 15d is a side elevation drawing of a four-position tool head.
Figure 15E:
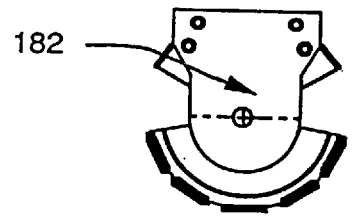
FIG. 15e is a side elevation drawing of a five-position tool head.

Returning attention to the tool head assembly 180 of FIG. 14 and also to FIG. 15*c*, the tool head assembly 180 provides a rotationally mounted multi-faceted, turret or gripper head 190 which supports various distinct grippers 165 and tools 192 at each of the facet surfaces 280. The head 190 may include any number of facets 280 and one or more of the facets may be used for the same or different operations. As necessary, ones of the facets may also not be populated with tools.

A desired facet 280 can be rotated to position via a stepper motor 282 which indexes the facets in relation to a piston or pin position lock 284. The lock 284 mates with radial locating holes 286 to precisely define each tool position. The motor 282 couples to a geared strip or rack 288 that extends from a counterbalance plate 290. The plate 290 reduces the inertia to rotate the tool facets 280 and tools, and generally balances the load at the head. The tool facets 280 are modular and are individually secured to the head at mounting projections 292. Associated photo optic sensors (not shown) are mounted about the head 190 to monitor head movement and provide corresponding control signals to the micro controller 42.

Particularly, secured to each facet of the head 190 is a so called "penny gripper" assembly 165. Grippers of this type find wide application with most components and support the pick-and-place fingers 164 which are mounted to expand and contract under appropriate control signals to the gripper 165.

Figure 15F:
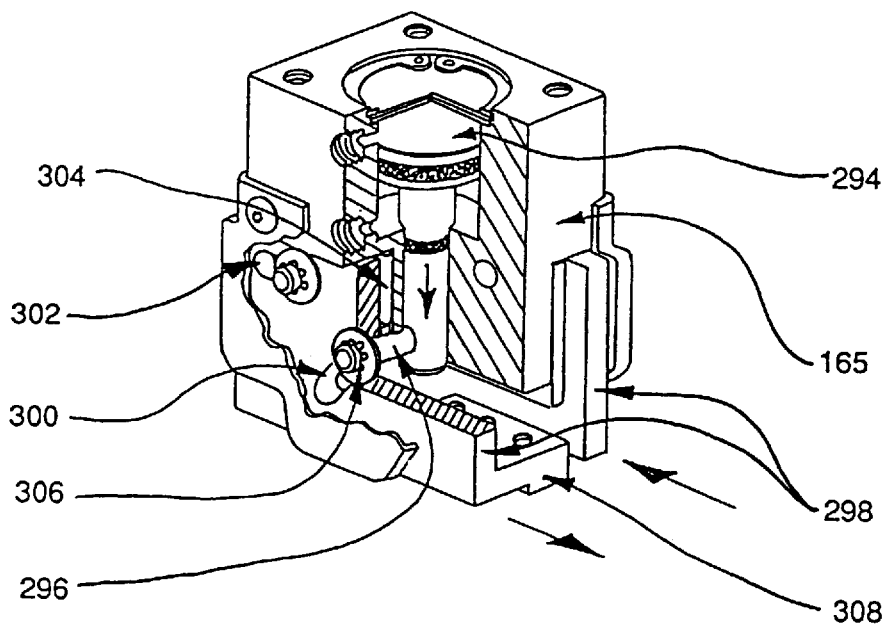
FIG. 15f is a detailed perspective drawing shown in cutaway of the parallel gripper portion of the tool head.

One gripper assembly 165 is depicted in detail at FIG. 15*f*. The gripper 165 is configured about a pneumatic piston 294 which determines the gripping motion. A pin 296 extends from the piston 294 and translates vertical piston motion to a horizontal opposing motion of the finger bases 298 via elongated slots 300, 302 let into each finger base 298. The slots 300 are inclined at an angle less than 35 degrees from the longitudinal axis of the piston. Two additional horizontal slots 302 and intermediate needle bearings 304 independently, horizontally direct each finger base 298. The finger bases 298 are preloaded under spring tension for accuracy with spring washers 306. The lower end of each finger base 298 defines a tooling face 308 whereto the fingers 164 are attached. Sensors, such as photo optic couplers, are also mounted to the gripper 165 to monitor and further control the motion of the finger bases. Electrical connections to such sensors are facilitated through the flexible circuitry and conductive bands discussed above.

Figure 16:
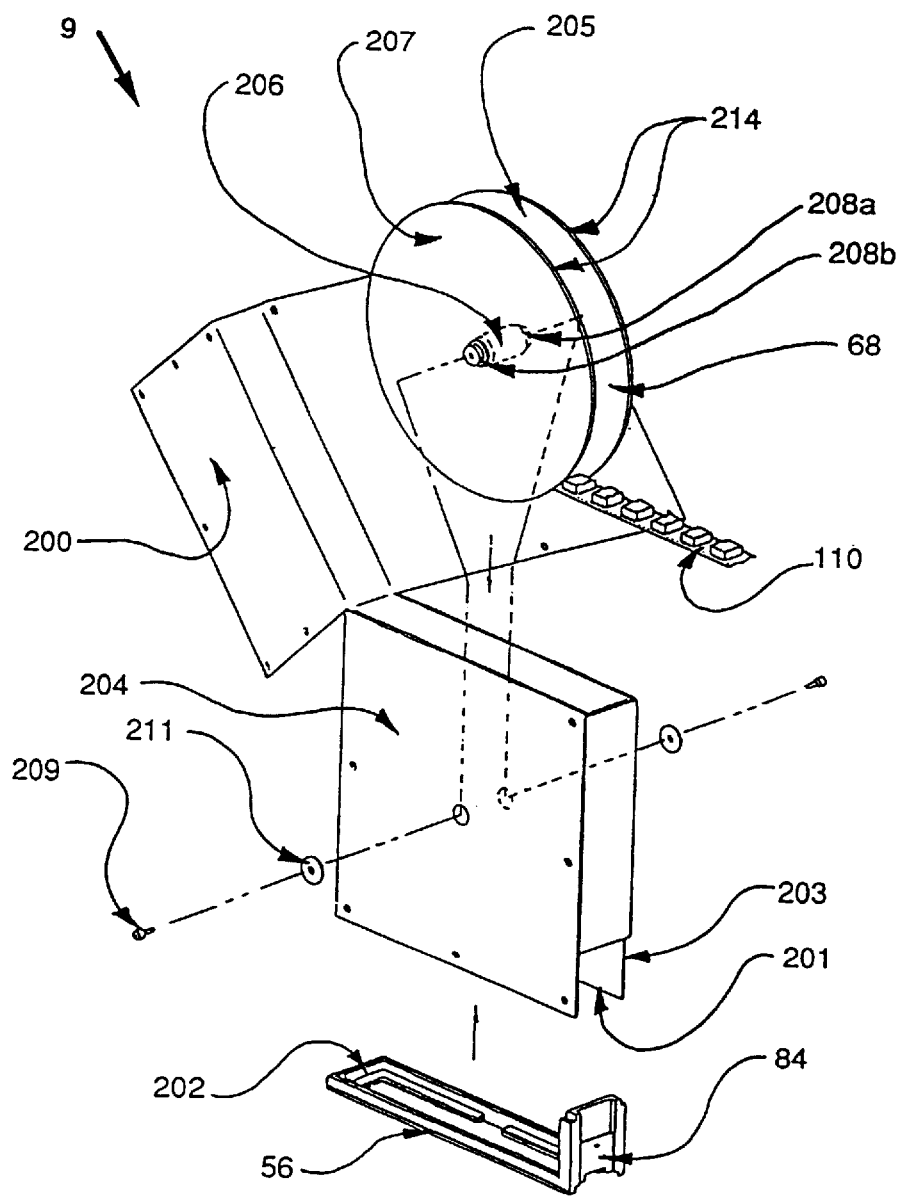
FIG. 16 is a perspective drawing shown in exploded assembly drawing of a component tape cartridge.

Returning attention to the details of the tape 110 and cartridges 48, FIG. 16 depicts an exploded assembly drawing of a typical tape cartridge 9. Each cartridge is generally comprised of an external folded shell or housing 200. The housing 200 is typically formed of a plastic material that is folded to shape and appropriately secured to create a durable five sided outer shell. The lower, open end and corner of an adjacent side receive a formed metal extrusion assembly 202 which is bonded to the shell 200 at the edges 201, 203. The portion of the extrusion 202 mounted to the short edge 203 contains the mentioned spring biased and apertured shutter door 84. The bottom surface of the extrusion 202 contains a rail portion 56 which mates with the housing slide track 46.

Positioned internally of the outer shell 200 is a second folded sheet goods liner 204 which supports a bushing or axle 206 containing end bearing surfaces and the tape reel 68. In combination, the outer shell and liners 200, 204 form a relatively rigid protective casing about the center mounted reel 68, tape 110 and contained components.

The tape reel 68 is formed in two halves 205, 207 and each of which supports a cylindrical piece 208*a* and 208*b*. The pieces 208*a* and 208*b* mate with each other to form the bushing 206. Each core portion extends from the inner surface of one of the reel halves 205, 207. A pair of screw fasteners 209 and washers 211 mount to the bushing 206 to secure the halves 205, 207 to one another and to the liner 204 in a fashion which permits rotation of the reel 68 within the liner. The reel 68, otherwise, is of conventional construction.

The peripheral edges 214 of the reel 68 are widened to provide frictional drive surfaces relative to the drive wheels 60 which extend from the housing 28. Secured to the axle 206 is a tape leader 92 which is formed of a length of material similar to that used to form the tape substrate. It is sufficiently long to permit extension to the splice station 74 and terminates with a male splice block 90. Alternatively, a female splice block may be secured to the leader 92.

Figure 17:
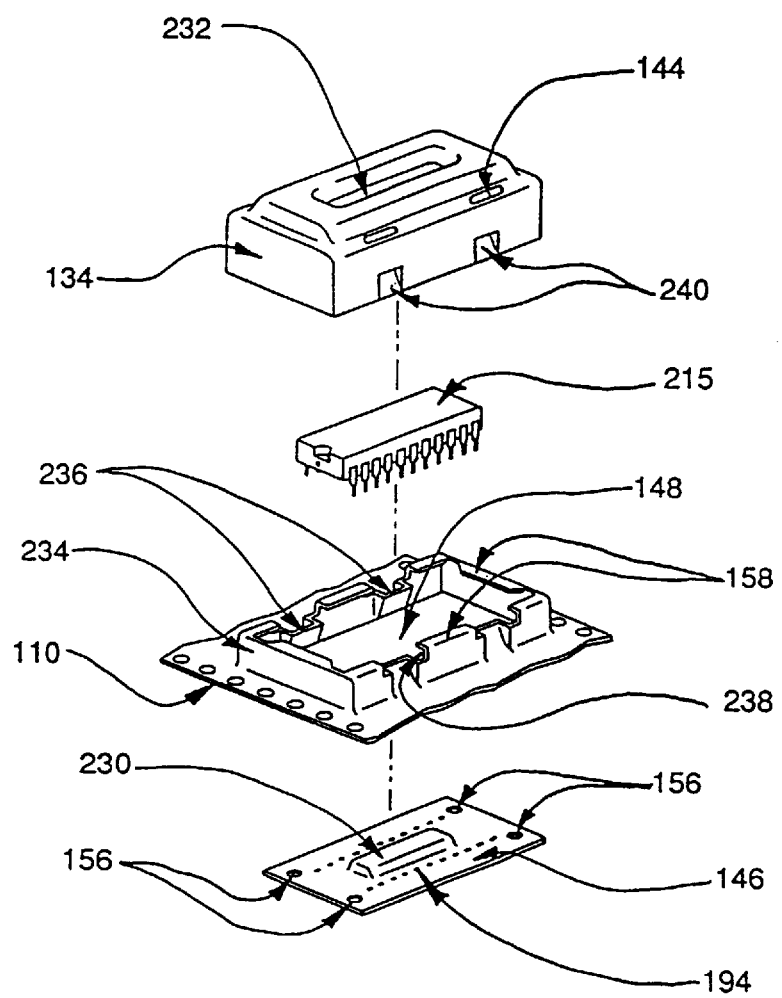
FIG. 17 is a perspective drawing shown in exploded assembly of one palletized component storage location.

FIG. 17 depicts an exploded perspective drawing of a single component storage location 135 of the component tape 110. A conventional dual-in-line (DIP) integrated circuit 215, including opposite edge mounted parallel rows of pin connector terminals is specifically shown in relation thereto. A raised platform 230 extends from the pallet 146 to elevate and support the body of the component 215 and permit room for the gripper fingers 164 to grip the component. A complementary depression 232 is formed in the top of the cover 134 such that the component 215 is constrained between the two formed regions 230, 232 and vertical movement prevented.

The periphery of the pallet 146 and cover 134 are formed to a standardized size and shape relative to a raised annular ring 234 of the carrier tape 110. The pallet 146 interlocks with the sidewalls 234 at four tapered projections 236. Orthogonal flanges 158, otherwise, project inward in the space between each tapered projection 236. A gap or space 238 is provided between the bottom of the flanges 158 and the top of the projections 236 to retain the pallet 146. Each pallet 146 is fitted into the annular ring 234 by positioning each pallet 146 beneath the ring 234 and raising the pallet. The pallet 146 flexes the projections 236 as it is raised along the sidewalls 234, and the projections 236, expand beneath the pallet 146, which is restrained, to partially fill the upper gap 238.

Each cover 134, in turn, includes tapered projections 240 which align with the recess formed by each tapered sidewall projection 236. Upon lowering a cover 134 over an annular storage location 148, the cover walls flex until the projections 240 pass the pallet 146, when the cover walls re-expand to secure the cover 134 to the pallet 146. The cover 134 is thereby constrained to the pallet 146 which, in turn, is constrained beneath the upper flange 158.

Cover removal is effected at each storage location 148 via the plurality of fingers 142 which project from the cover removal assembly 130 to engage the cover in the region of the four cover recesses 240. Once the fingers 142 are lowered and engaged, the lift solenoid 138 is actuated which causes the fingers 142 to remove the cover 134. The peripheral edges of the pallet 146 flex slightly to permit release, although the dimensional tolerances are typically adjusted to permit minimal flexing. Over time, it may periodically be necessary to recondition a tape 110 by replacing worn or broken pallets 146 or covers 134. Under normal conditions and the typical flexing stresses that are encountered, it is anticipated that each tape 110 can be used in excess of twenty-five times. Depending upon the quality of materials, this reusability can be further enhanced.

In passing it is also to be appreciated that the lift and locate assembly 132 (reference FIG. 10) includes associated sensors shown at FIG. 25 which provide feedback information to the controller 30 and pick-and-place assembly 33 whereby empty storage locations 148 and/or empty component positions on a pallet 146 are detected and avoided. Extraneous equipment movement is thereby minimized.

Figure 18:
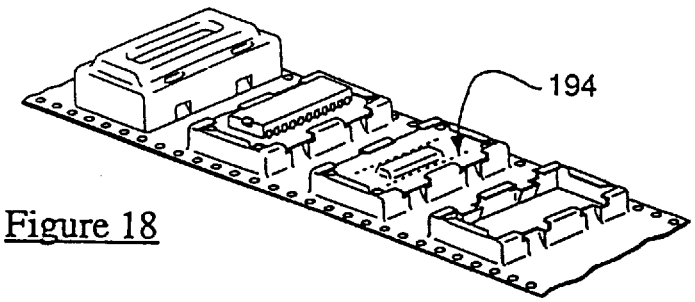
FIG. 18 is a perspective drawing of a section of tape carrier including pallets for supporting dual-in-line (DIP) components.
Figure 19:
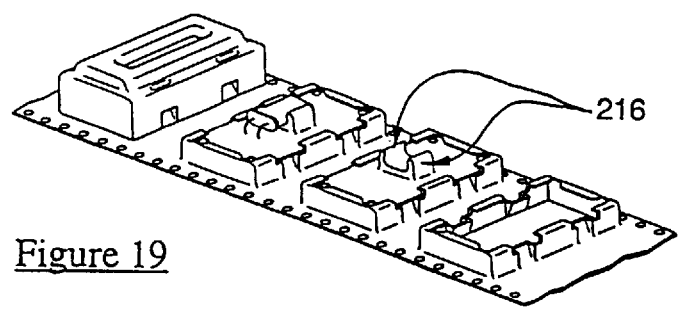
FIG. 19 is a perspective drawing of a section of tape carrier including pallets having resilient component grasping projections.
Figure 20:
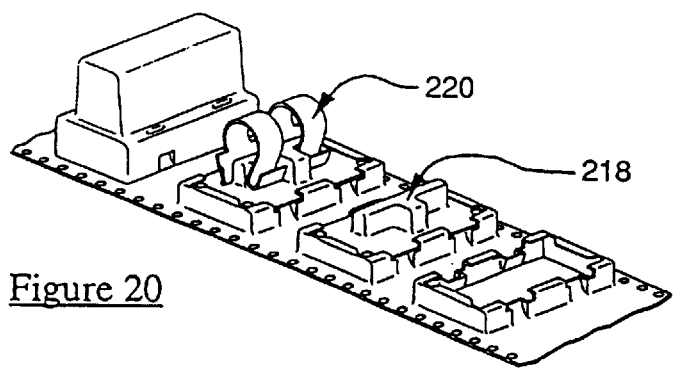
FIG. 20 is a perspective drawing of a section of tape carrier including component fastener clips, with friction walled projections.
Figure 21:
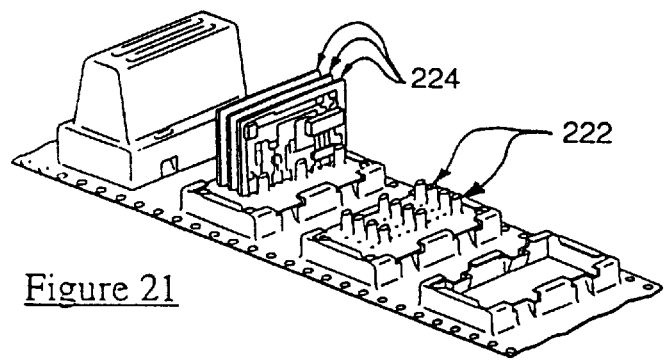
FIG. 21 is a perspective drawing of a section of a tape carrier wherein the pallet includes projections for indexing and supporting a plurality of populated, edge mounted, thick film hybrid components.

Appreciating the varieties of odd component shapes which exist in typical PCB fabrication processes, the present tape carrier 110 is configured to accommodate a broad selection of component shapes and types. FIGS. 18 to 24 show a variety of perspective drawings of tape segments wherein the component pallets 146 and covers 134 are variously formed to accommodate some of these components. FIGS. 17 and 18 show an arrangement for supporting conventional DIP packages. FIG. 19 discloses an arrangement wherein the component pallet 146 includes resilient arcuate fingers 216 which project from the pallet surface to compressively restrain a component, such as a crystal oscillator, between the fingers 216. FIG. 20 shows a pallet 146 including a thermoformed projection 218 which is used to orient a component 220. FIG. 21 shows still another pallet 146 which includes a plurality of spaced projections 222. Thick film hybrid assemblies 224 or the like are contained between rows of the projections 222.

Figure 22:
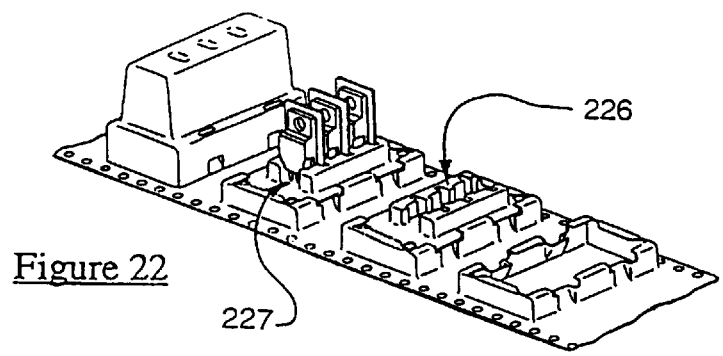
FIG. 22 is a perspective drawing of a section of a tape carrier wherein the pallet includes indexed recesses for supporting edge mounted components and provides spacing allowing component pickup.

FIG. 22 shows another component pallet which also accommodates a nested edge mounting of the components. The elevated portion of the pallet surface particularly provides a plurality of cavities 226 which conform to and nest each component. A finger access channel 227 extends the width of the elevated platform and provides space to accommodate the gripper fingers.

Figure 23:
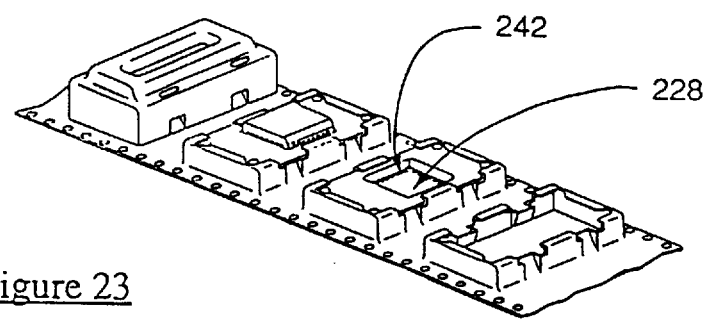
FIG. 23 is a perspective drawing of a section of a tape carrier wherein the pallet includes a multi-apertured recess for receiving surface mount components.
Figure 24:
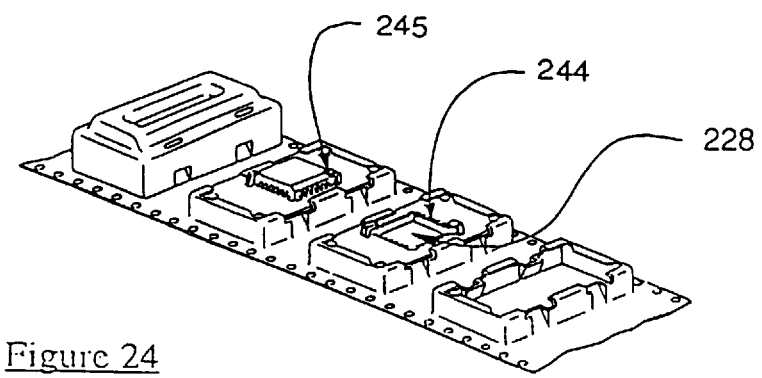
FIG. 24 is a perspective drawing of a section of a tape carrier, similar to FIG. 23 but including lead wire spacer tabs.

FIGS. 23 and 24 disclose pallets containing flat pack receiving cavities 228. Such components contain conductors on all four edges. Apertures 242 are provided in each pallet to permit access by the grippers 164, to support the lead wire terminations and permit contact thereto for testing. Additional apertures may be provided to support still other test fixtures. The pallet of FIG. 24 also provides a plurality of combed projections 232 which separate the adjacent lead wires. The combination of the cavities 228, projections 244, and cover 134 passively restrain and fully enclose each component.

Optionally, each pallet can include a compliant corner projection 245 to separately restrain each component to the cavity 228. When included, a cover 134 is not required. In such circumstances, the fingers 164 are constructed to expand and release the projections.

Depending upon the particular component mounting, the pick-and-place assembly 33 or robotic arm 24 is positionally programmed relative to the precise position of the lift and locate assembly 132 and a pallet 146 and component supported thereat. The position is particularly established to a tolerance of plus/minus 0.0004 inch. Such a tolerance has heretofore not been achievable, except possibly for some large volume, uniform component packaging systems. Such a positional accuracy and the elevated arrangement of the pallets enables the associated handler assemblies to not only locate singular components positioned on the pallets, but also to select one of a number of components mounted on a pallet, such as in the constructions of FIGS. 21 and 22.

A further advantage of the present tape carrier 110 is that each feeder station 4 is essentially waste free. That is and in contrast to other known tape component carrier systems, a separate collection mechanism must be provided for spent binding tape or covers. While in some cases the binder tape may be re-utilized, this requires a re-weaving of the tape relative to the component loading operation which in turn requires special equipment. The present feeder achieves both functions within a singular assembly.

While the foregoing invention has been described with respect to its presently preferred construction, along with various considered modifications and improvements thereto, it is to be appreciated that still other modifications may suggest themselves to those of skill in the art. Accordingly, the invention should not be narrowly interpreted. Rather, the invention should be interpreted to include all those equivalent embodiments within the spirit and scope of the following claims. Furthermore, the prior applications referenced on page 1 of this document are hereby incorporated by reference in their entirety for all purposes.

What is claimed is:

1. An automated component placement apparatus comprising:
   a plurality of toolheads adapted to pick up and release components;
   a plurality of component feeder stations, each adapted to continuously supply components to allow the toolheads to pick up components for placement on PC boards;
   a plurality of PC board assembly areas for releasably receiving and supporting PC boards;
   a transport means for moving the PC boards between the PC board assembly areas;
   a plurality of gantry systems, each gantry system including a horizontal drive means and a generally horizontal linear track, the horizontal drive means for supporting and driving an associated one of the plurality of toolheads in a generally horizontal direction along the generally horizontal linear track between at least one of the plurality of component feeder stations and at least one of the plurality of PC board assembly areas; and
   a programmable controller means coupled to the plurality of toolheads and the plurality of gantry systems and for causing each of the plurality of toolheads to move from a position at at least one of the plurality of component feeder stations to at least one of the plurality of PC board assembly areas and for further causing each of the plurality of toolheads to pick up components at at least one of the plurality of component feeder stations and place the components at a desired location on the PC boards.

2. The apparatus of claim 1 wherein each of the plurality of gantry systems includes:
   a vertical drive means for driving an associated one of the plurality of toolheads in a generally vertical direction.

3. The apparatus of claim 1 wherein at least one of the plurality of component feeder stations includes means for receiving a supply reel of tape-mounted components.

4. The apparatus of claim 3 wherein at least one of the plurality of component feeder stations includes means for receiving a supply reel of tape-mounted components which is contained within a supply cartridge.

5. The apparatus of claim 1 wherein at least one of the plurality of component feeder stations includes means for releasably receiving supply cartridges of components; and
   the apparatus further includes:
      a supply cartridge conveyor to convey supply cartridges to and from each one of the plurality of component feeder stations; and
      a supply cartridge loading means positioned at the supply cartridge conveyor to unload empty supply cartridges from the plurality of component feeder stations and load full supply cartridges into the plurality of component feeder stations.

6. The apparatus of claim 3 wherein the plurality of toolheads, the plurality of gantry systems, and the plurality of component feeder stations are positioned adjacent to one another.

7. The apparatus of claim 6 wherein the plurality of toolheads, the plurality of gantry systems, and the plurality of component feeder stations are generally parallel to one another and a common PC board transport means passes generally perpendicularly across the plurality of toolheads, the plurality of gantry systems, and the plurality of component feeder stations.

8. The apparatus of claim 1 wherein at least one of the plurality of gantry systems, an associated one of the component feeder stations, and an associated one of the plurality of toolheads has a dedicated programmable controller means.

9. The apparatus of claim 1 and further including a work station interfaced to the programmable controller means.

* * * * *